(12) United States Patent
Onodera et al.

(10) Patent No.: US 10,573,461 B2
(45) Date of Patent: Feb. 25, 2020

(54) ELECTRONIC COMPONENT AND ELECTRONIC COMPONENT DEVICE

(71) Applicant: TDK CORPORATION, Tokyo (JP)

(72) Inventors: Shinya Onodera, Tokyo (JP); Takehisa Tamura, Tokyo (JP); Atsushi Takeda, Tokyo (JP); Ken Morita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/119,249

(22) Filed: Aug. 31, 2018

(65) Prior Publication Data

US 2019/0080845 A1 Mar. 14, 2019

(30) Foreign Application Priority Data

Sep. 8, 2017 (JP) .................................. 2017-173408

(51) Int. Cl.
| | |
|---|---|
| *H01G 4/232* | (2006.01) |
| *H01G 4/248* | (2006.01) |
| *H01G 4/30* | (2006.01) |
| *H05K 1/02* | (2006.01) |
| *H05K 1/11* | (2006.01) |

(Continued)

(52) U.S. Cl.
CPC ............. *H01G 4/248* (2013.01); *H01G 4/232* (2013.01); *H01G 4/2325* (2013.01); *H01G 4/30* (2013.01); *H05K 1/0271* (2013.01); *H05K 1/111* (2013.01); *H05K 1/181* (2013.01); *H01G 4/1227* (2013.01); *H01G 4/1236* (2013.01); *H01G 4/1245* (2013.01); *H05K 3/3442* (2013.01);

(Continued)

(58) Field of Classification Search
CPC ...... H01G 2/065; H01G 4/232; H01G 4/2325; H01G 4/248; H01G 4/30; H01G 4/1245; H01G 4/1227; H01G 4/1236; H01G 4/12; H05K 1/0271; H05K 1/111; H05K 1/181; H05K 1/02; H05K 1/11; H05K 1/18; H05K 3/3442; H05K 2201/10015; H05K 2201/10636
USPC ............................ 174/260; 361/306.3, 301.4
See application file for complete search history.

(56) References Cited

U.S. PATENT DOCUMENTS

| | | | | |
|---|---|---|---|---|
| 9,368,282 | B2 * | 6/2016 | Moon | H01G 4/30 |
| 2013/0294006 | A1 * | 11/2013 | Kang | H01G 4/2325 |
| | | | | 361/301.4 |

(Continued)

FOREIGN PATENT DOCUMENTS

| | | | | |
|---|---|---|---|---|
| JP | H08-107038 A | | 4/1996 | |
| JP | 08203770 A | * | 8/1996 | ............... H01G 4/12 |

*Primary Examiner* — Timothy J Thompson
*Assistant Examiner* — Guillermo J Egoavil
(74) *Attorney, Agent, or Firm* — Darle M. Short

(57) ABSTRACT

An element body of a rectangular parallelepiped shape includes a first principal surface arranged to constitute a mounting surface, a second principal surface opposing the first principal surface in a first direction, a pair of side surfaces opposing each other in a second direction, and a pair of end surfaces opposing each other in a third direction. An external electrode is disposed at an end portion of the element body in the third direction. The external electrode includes a conductive resin layer. The conductive resin layer covers a region near the first principal surface of the end surface. A height of the conductive resin layer in the first direction is larger at an end portion in the second direction than at a center in the second direction, when viewed from the third direction.

25 Claims, 17 Drawing Sheets

(51) Int. Cl.
*H05K 1/18* (2006.01)
*H01G 4/12* (2006.01)
*H05K 3/34* (2006.01)

(52) U.S. Cl.
CPC ............. *H05K 2201/10015* (2013.01); *H05K 2201/10636* (2013.01)

(56) References Cited

U.S. PATENT DOCUMENTS

| | | | |
|---|---|---|---|
| 2016/0172108 A1* | 6/2016 | Ikeda | H01G 4/2325 361/301.4 |
| 2018/0068792 A1* | 3/2018 | Egashira | H01B 1/02 |
| 2018/0144867 A1* | 5/2018 | Park | H01G 2/06 |
| 2018/0151296 A1* | 5/2018 | Yamada | H01G 2/065 |
| 2019/0131072 A1* | 5/2019 | Onodera | H01G 2/065 |
| 2019/0237259 A1* | 8/2019 | Onodera | H01G 4/30 |
| 2019/0237261 A1* | 8/2019 | Onodera | H01G 4/30 |

* cited by examiner

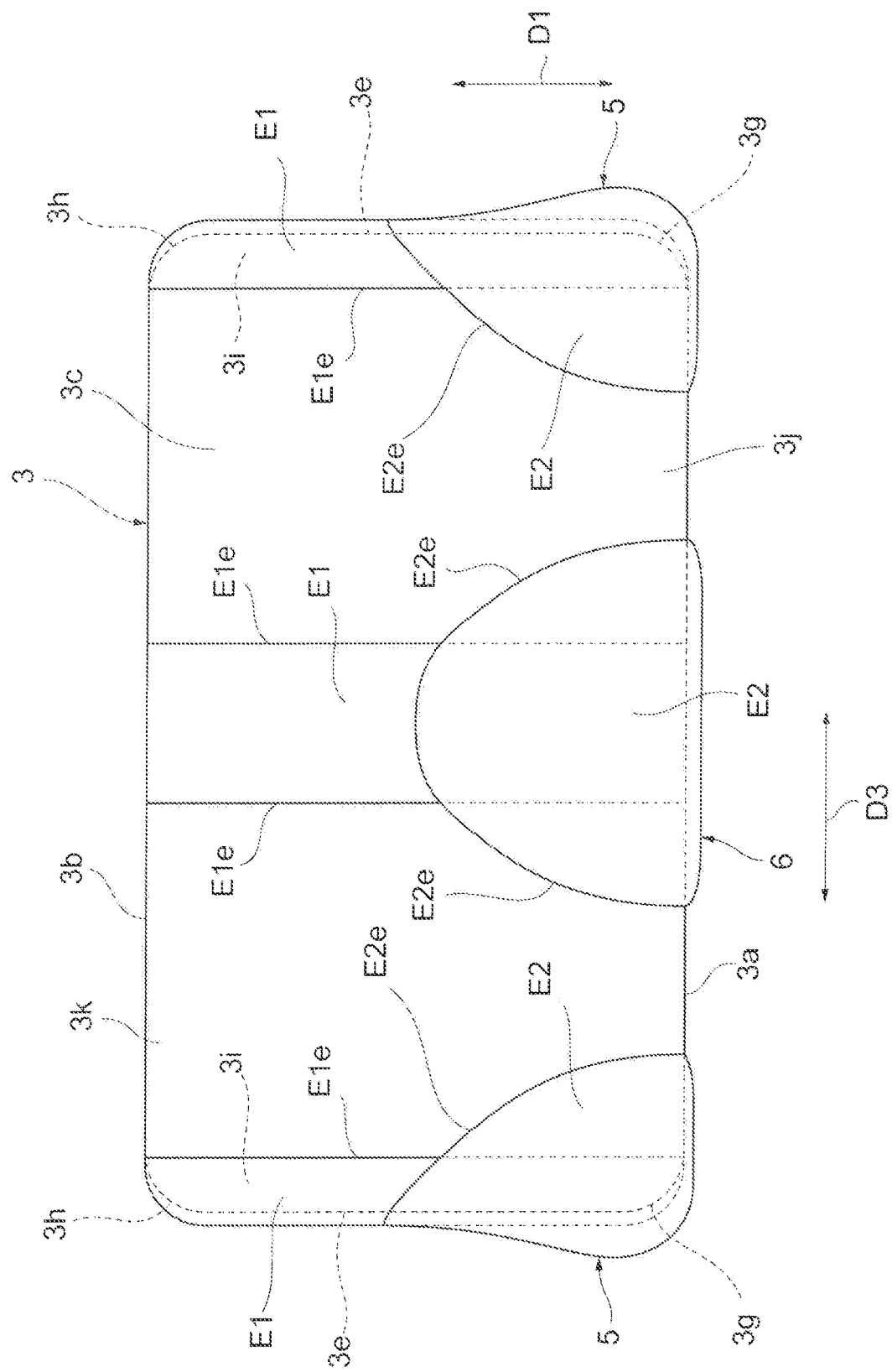

ELECTRONIC COMPONENT AND
ELECTRONIC COMPONENT DEVICE

BACKGROUND OF THE INVENTION

1. Field of the Invention

The present invention relates to an electric component and an electric component device.

2. Description of Related Art

Known electronic components include an element body of a rectangular parallelepiped shape and a plurality of external electrodes (see, for example, Japanese Unexamined Patent Publication No. H8-107038). The element body includes a pair of principal surfaces opposing each other, a pair of end surfaces opposing each other, and a pair of side surfaces opposing each other. The plurality of external electrodes is disposed at each end portion of the element body in a direction in which the pair of end surfaces opposes each other. The external electrode includes a conductive resin layer covering the entire end surface.

SUMMARY OF THE INVENTION

An object of one aspect of the present invention is to provide an electronic component including a conductive resin layer that tends not to peel off from an element body and having an improved moisture resistance reliability. An object of another aspect of the present invention is to provide an electronic component device including a conductive resin layer that tends not to peel off from an element body, and having an improved moisture resistance reliability.

An electronic component according to one aspect includes an element body of a rectangular parallelepiped shape and a plurality of external electrode. The element body includes a first principal surface arranged to constitute a mounting surface, a second principal surface opposing the first principal surface in a first direction, a pair of side surfaces opposing each other in a second direction, and a pair of end surfaces opposing each other in a third direction. The plurality of external electrodes is disposed at both end portions of the element body in the third direction. The plurality of external electrodes includes a conductive resin layer covering a region near the first principal surface of a corresponding end surface of the pair of end surfaces. A height of the conductive resin layer in the first direction is larger at an end in the second direction than at a center in the second direction, when viewed from the third direction.

In the one aspect, a height of the conductive resin layer in the first direction is, when viewed from the third direction, larger at the end in the second direction than at the center in the second direction. Therefore, the conductive resin layer tends not to peel off from the element body. Moisture may infiltrate into the region between the element body and the conductive resin layer. In a case where moisture infiltrates from the region between the element body and the conductive resin layer, durability of the electronic component decreases. The one aspect includes few paths through which moisture infiltrates, as compared with a configuration in which the conductive resin layer covers the entire end surface. Therefore, the one aspect improves moisture resistance reliability. Consequently, the one aspect provides the electronic component including the conductive resin layer that tends not to peel off from the element body, and having the improved moisture resistance reliability.

In a case in which an element is described as covering another element, the element may directly cover the other element or indirectly cover the other element.

In the one aspect, the conductive resin layer may cover a region near the first principal surface of the first ridge portion located between the corresponding end surface and the side surface. A height of a portion of the conductive resin layer covering the first ridge portion in the first direction may be larger than a height of the conductive resin layer at the center in the second direction, when viewed from the third direction. In this configuration, the conductive resin layer further tends not to peel off from the element body.

In the one aspect, the conductive resin layer may cover a region near the corresponding end surface of the first principal surface. In a case where the electronic component is solder-mounted on an electronic device, an external force applied onto the electronic component from the electronic device may act as a stress on the element body. The electronic device includes, for example, a circuit board or an electronic component. The external force acts on the element body from a solder fillet formed at the solder-mounting, through the external electrode. The external force tends to act on the region near the end surface of the first principal surface of the element body. In a configuration in which the conductive resin layer covers the region near the end surface of the first principal surface, the external force applied onto the electronic component from the electronic device tends not to act on the element body. Therefore, this configuration suppresses occurrence of a crack in the element body.

In the one aspect, the conductive resin layer may integrally cover a region near the corresponding end surface of the first principal surface and a region near the first principal surface of the corresponding end surface. In this configuration, the conductive resin layer reliably tends not to peel off from the end surface, and the external force acting on the electronic component from the electronic device reliably tends not to act on the element body.

In the one aspect, the conductive resin layer may integrally cover a region near the corresponding end surface of the first principal surface, a region near the first principal surface of the corresponding end surface, and a region near the first principal surface of the side surface. In this configuration, the conductive resin layer further reliably tends not to peel off from the end surface, and the external force applied onto the electronic component from the electronic device further reliably tends not to act on the element body.

The one aspect may include an internal conductor exposed to the corresponding end surface. The plurality of external electrodes may include a sintered metal layer formed on the corresponding end surface to be connected to the internal conductor. The sintered metal layer may include a first region covered with a conductive resin layer and a second region exposed from the conductive resin layer. In this configuration, the sintered metal layer is favorably in contact with the internal conductor. This allows reliable electrical connection between the external electrode and the internal conductor. The conductive resin layer includes a conductive material and a resin. The conductive material includes, for example, metal powder. The resin includes, for example, a thermosetting resin. Electric resistance of the conductive resin layer is larger than electric resistance of the sintered metal layer. In a case where the sintered metal layer includes the second region, the second region is electrically connected to the electronic device without passing through the conductive resin layer. Therefore, this configuration suppresses an increase in equivalent series resistance (ESR) even in a case where the external electrode includes the conductive resin layer.

In the one aspect, the sintered metal layer may also be formed on a first ridge portion located between the corresponding end surface and the side surface and a second ridge portion located between the corresponding end surface and the first principal surface. The conductive resin layer may cover a part of a portion of the sintered metal layer formed on the first ridge portion and an entirety of a portion of the sintered metal layer formed on the second ridge portion. The bonding strength between the conductive resin layer and the element body is smaller than the bonding strength between the conductive resin layer and the sintered metal layer. Therefore, the conductive resin layer may peel off from the element body. In this configuration, the conductive resin layer covers the part of the portion of the sintered metal layer formed on the first ridge portion and an entirety of the portion of the sintered metal layer formed on the second ridge portion. Therefore, in this configuration, even in a case where the conductive resin layer peels off from the element body, the peel-off of the conductive resin layer tends not to develop to a position corresponding to the end surface beyond a position corresponding to the first and second ridge portions.

In the one aspect, the plurality of external electrodes may include a plating layer that covers the conductive resin layer and the second region of the sintered metal layer. In this configuration, the electronic component can be solder-mounting on the electronic device. The second region of the sintered metal layer is electrically connected to the electronic device via the plating layer. Therefore, this configuration further suppresses the increase in the ESR.

An electronic component device according to another aspect includes the electronic component and an electronic device including a plurality of pad electrodes. Each of the plurality of external electrodes is connected to a corresponding pad electrode among the plurality of pad electrodes via a solder fillet.

In the other aspect, as described above, the conductive resin layer tends not to peel off from the element body and the moisture resistance reliability is improved.

In the other aspect, the electronic component may include an internal conductor exposed to the corresponding end surface. The external electrode may include a sintered metal layer disposed between the conductive resin layer and the element body. The sintered metal layer may include a first region covered with a conductive resin layer and a second region exposed from the conductive resin layer. The solder fillet may overlap the second region of the sintered metal layer when viewed from the third direction. In this configuration, the second region is electrically connected to the electronic device via the solder fillet. The second region is electrically connected to the electronic device without passing through the conductive resin layer. Therefore, this configuration suppresses the increase of the ESR even in a case where the external electrode includes the conductive resin layer.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 17 is a side view illustrating an element body, a first electrode layer, and a second electrode layer.

DETAILED DESCRIPTION OF EMBODIMENTS

Figure 1:
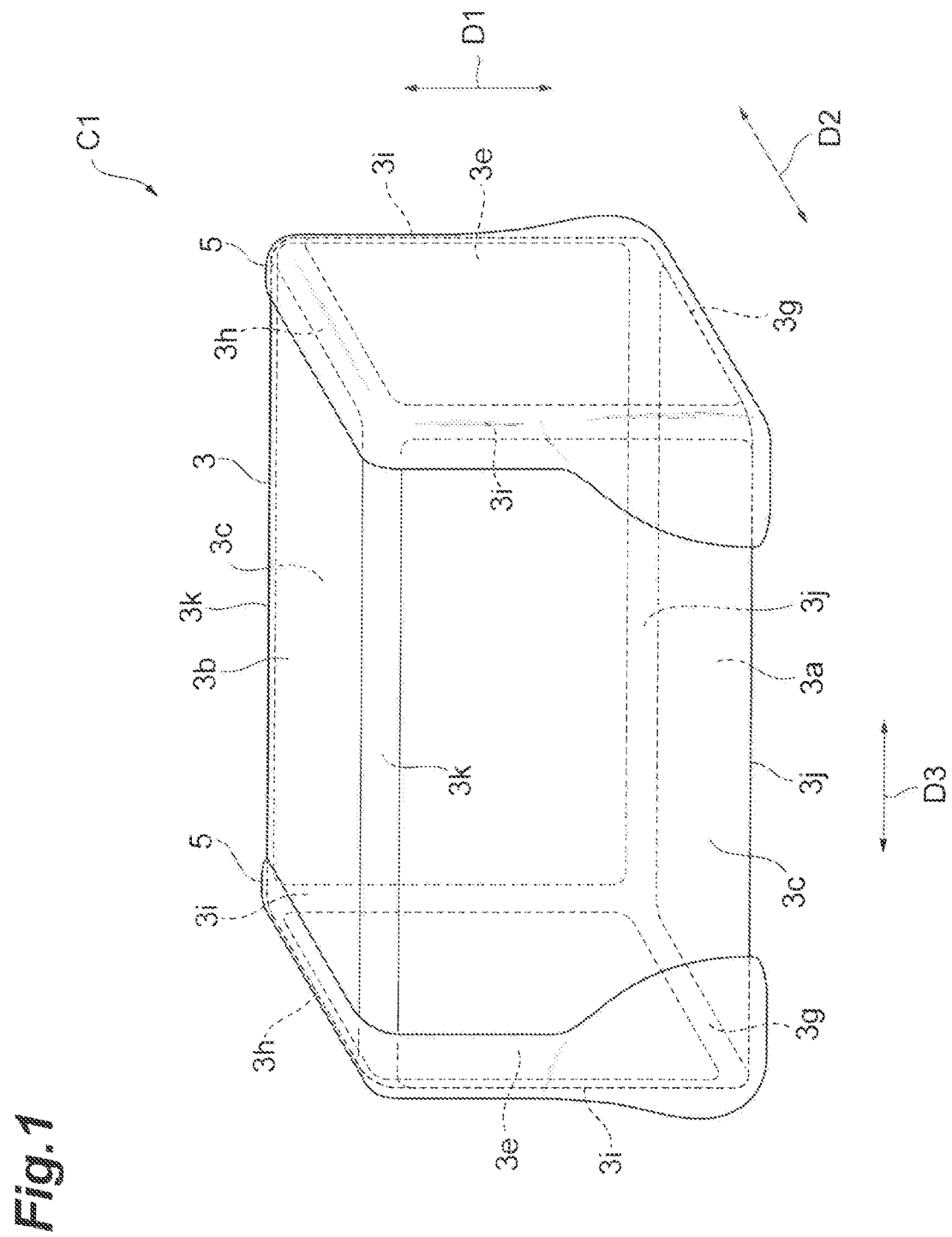
FIG. 1 is a perspective view of a multilayer capacitor according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
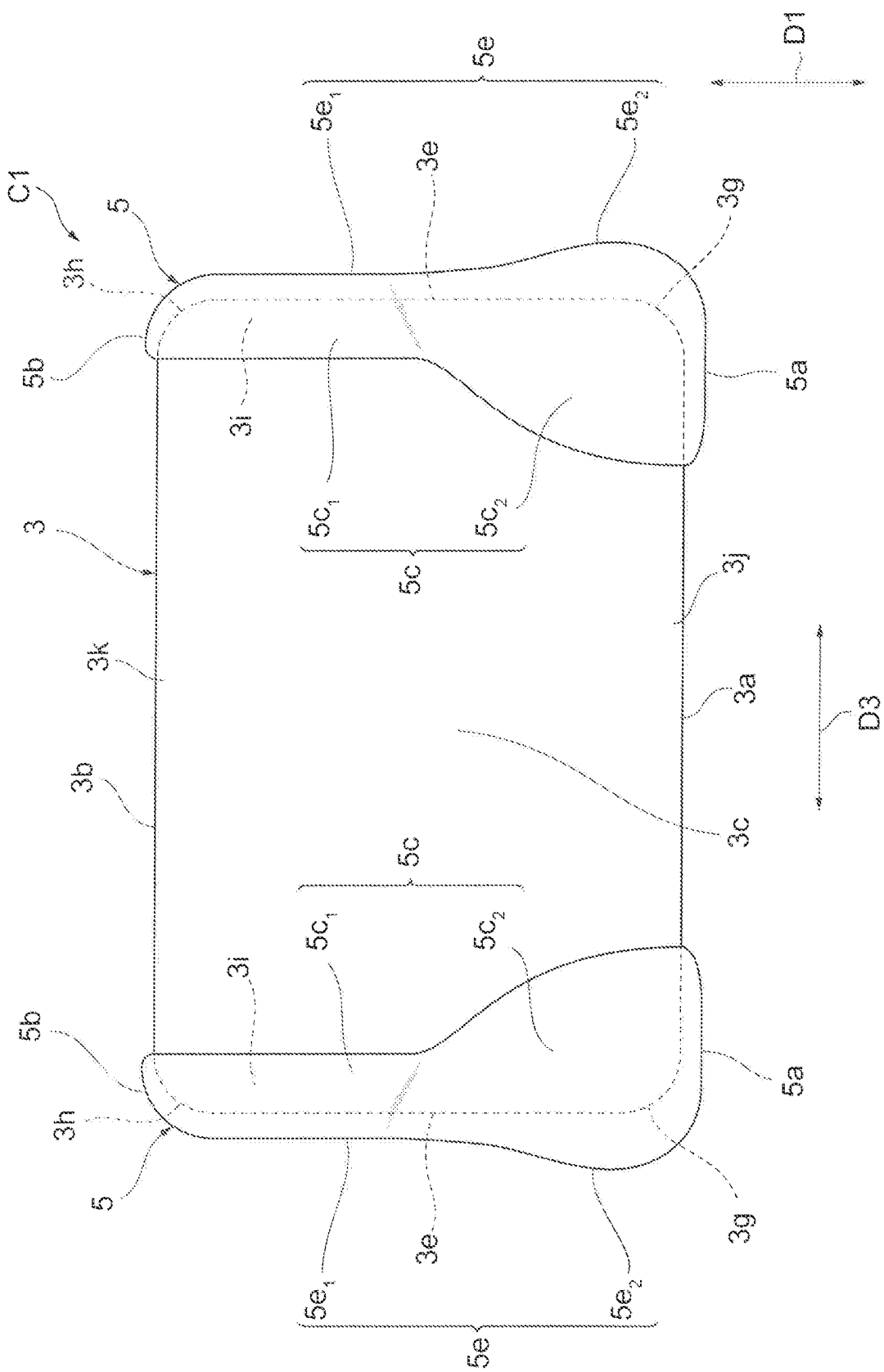
FIG. 2 is a side view of the multilayer capacitor according to the first embodiment.
Figure 3:
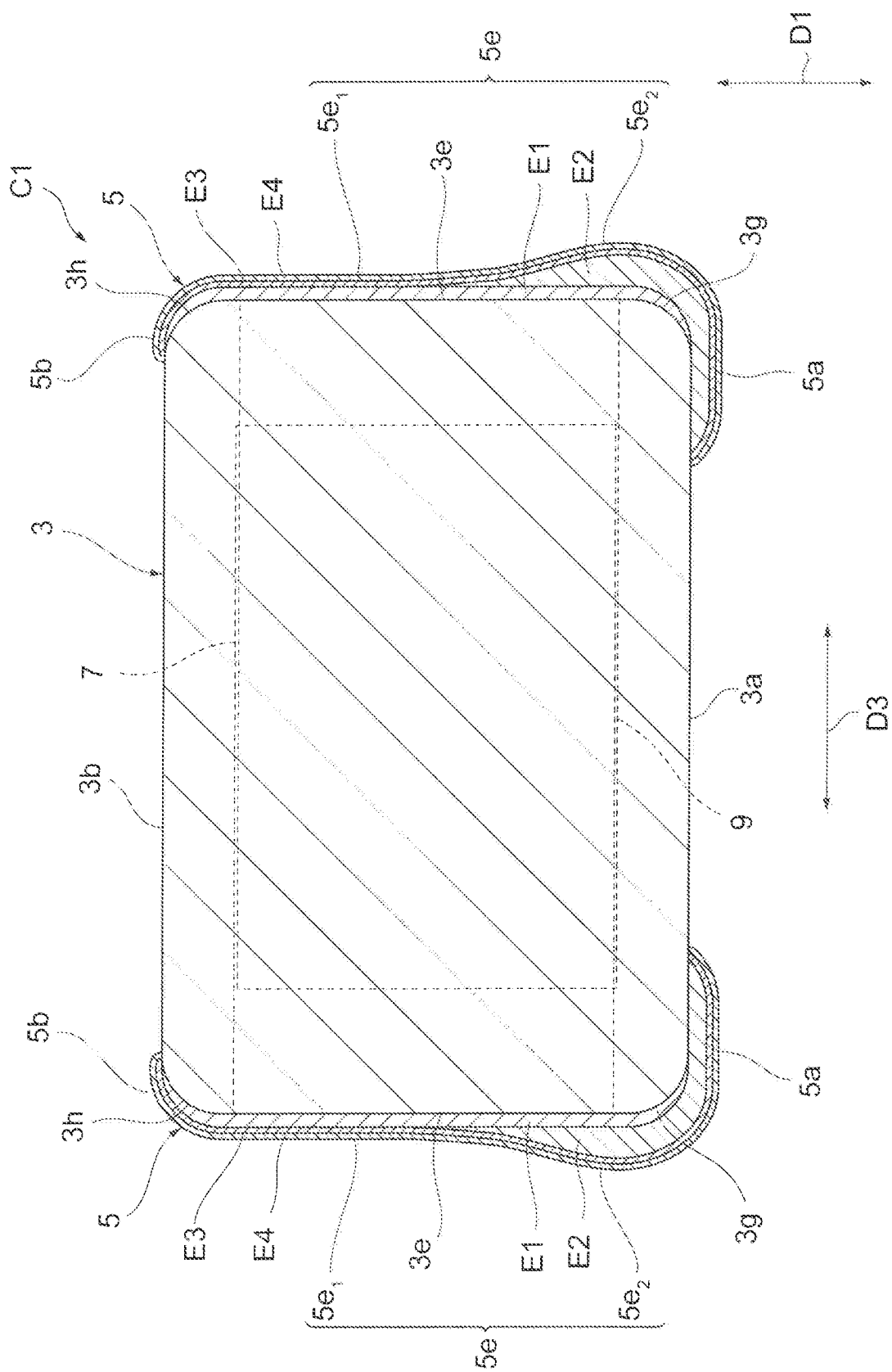
FIG. 3 is a view illustrating a cross-sectional configuration of the multilayer capacitor according to the first embodiment.
Figure 4:
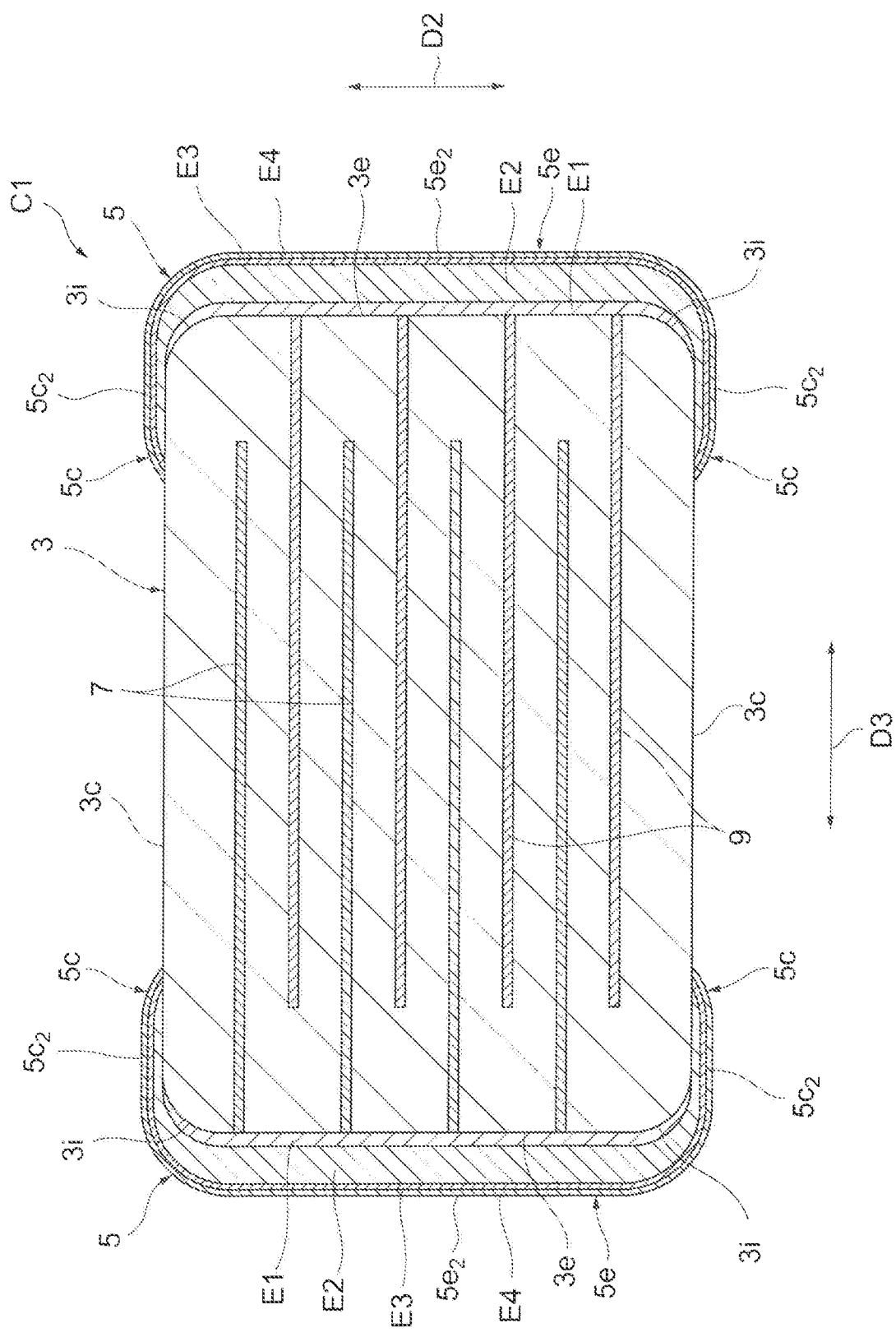
FIG. 4 is a view illustrating a cross-sectional configuration of the multilayer capacitor according to the first embodiment.
Figure 5:
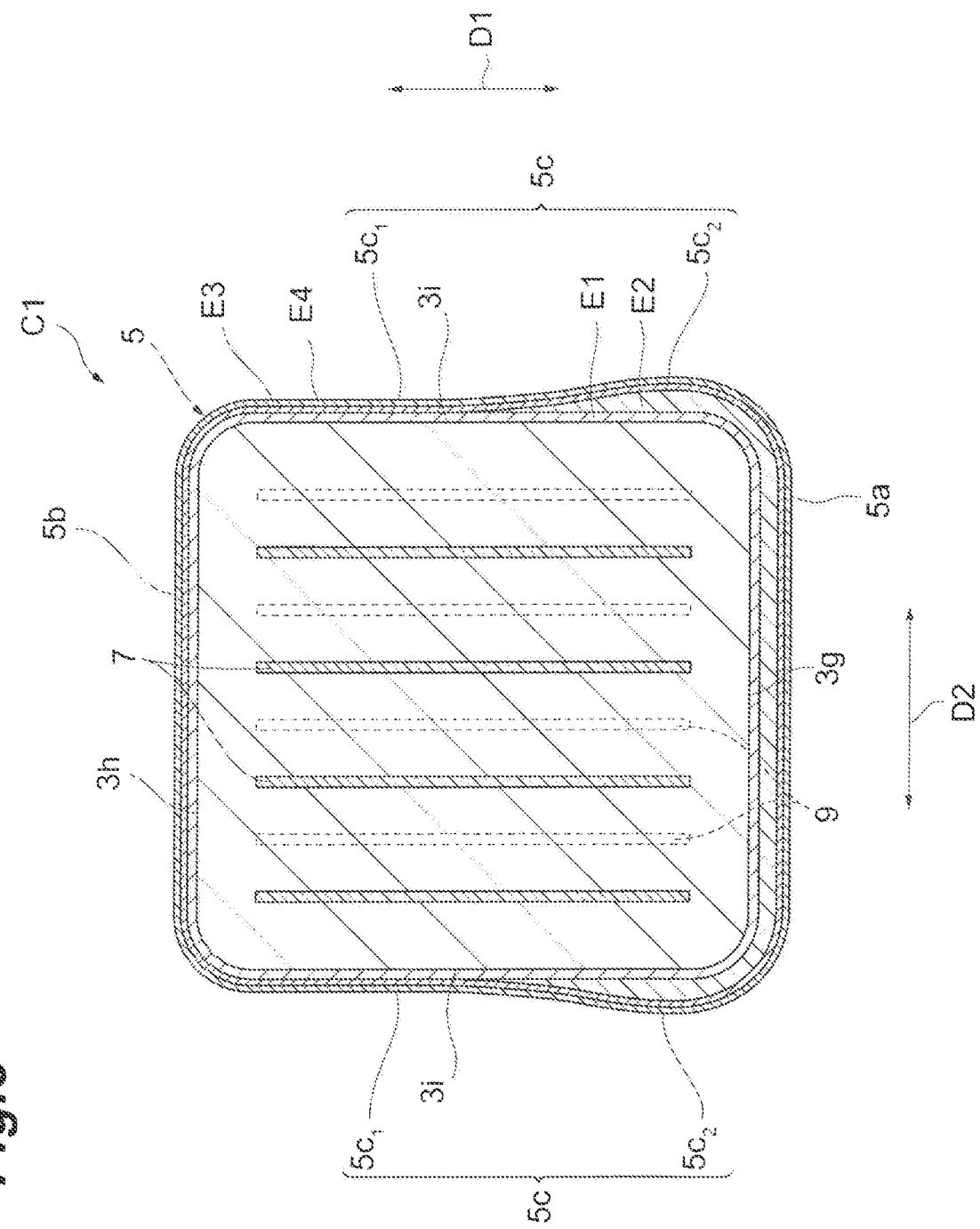
FIG. 5 is a view illustrating a cross-sectional configuration of the multilayer capacitor according to the first embodiment.
Figure 6:
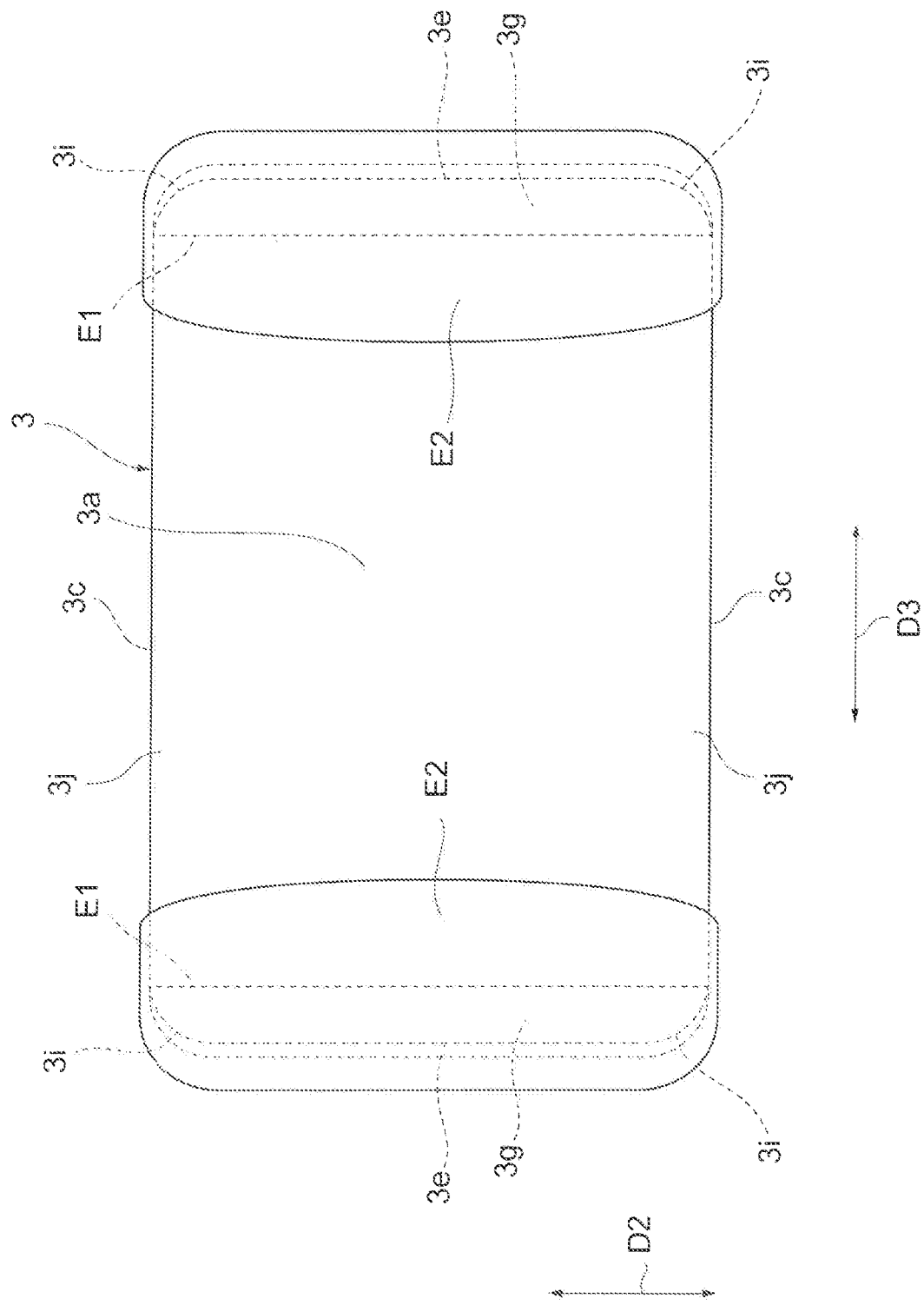
FIG. 6 is a plan view illustrating an element body, a first electrode layer, and a second electrode layer.
Figure 7:
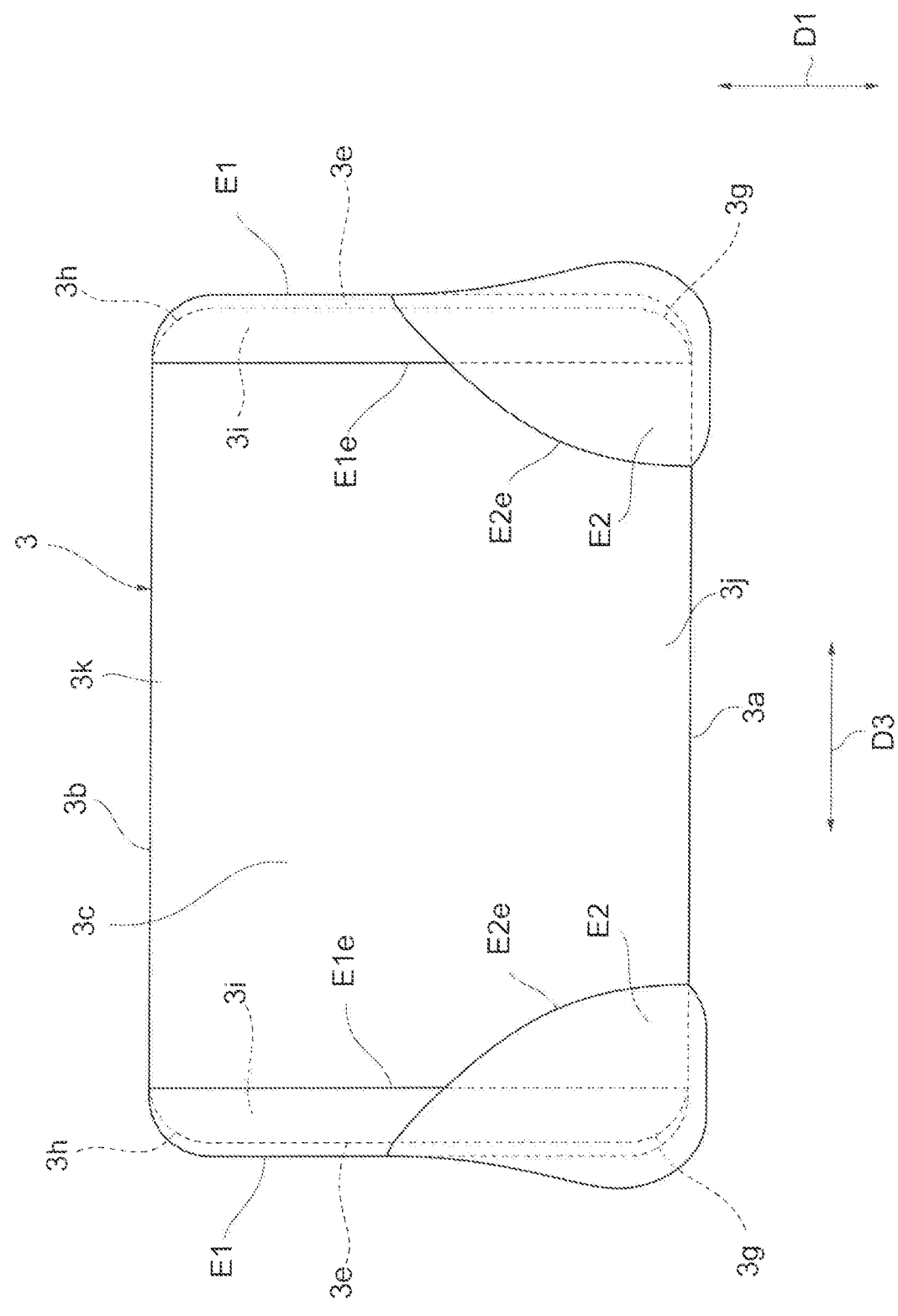
FIG. 7 is a side view illustrating the element body, the first electrode layer, and the second electrode layer.
Figure 8:
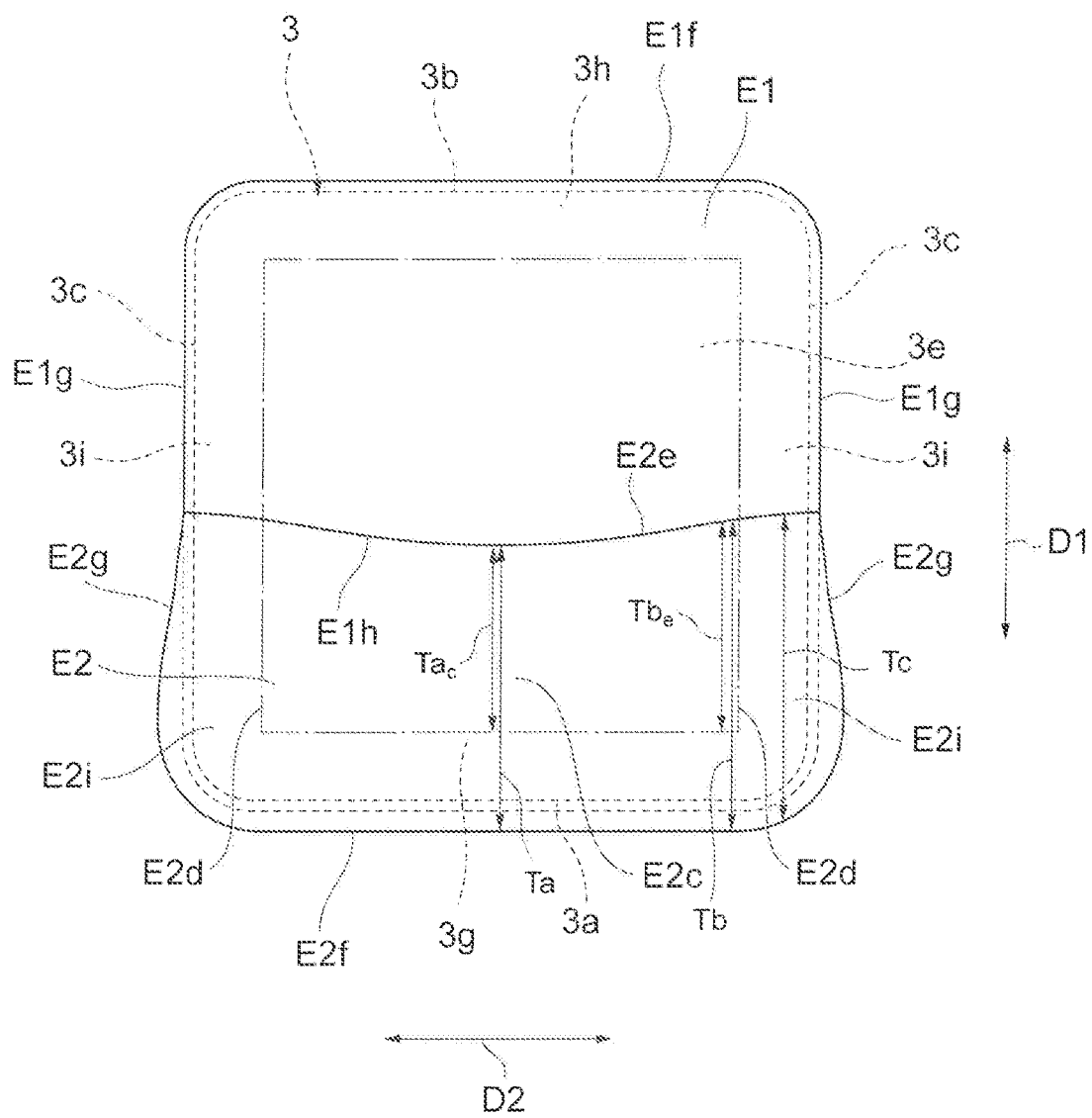
FIG. 8 is an end view illustrating the element body, the first electrode layer, and the second electrode layer.

A configuration of a multilayer capacitor C1 according to a first embodiment will be described with reference to FIGS. 1 to 8. FIG. 1 is a perspective view of the multilayer capacitor according to the first embodiment. FIG. 2 is a side view of the multilayer capacitor according to the first embodiment. FIGS. 3 to 5 are views illustrating a cross-sectional configuration of the multilayer capacitor according to the first embodiment. FIG. 6 is a plan view illustrating an element body, a first electrode layer, and a second electrode layer. FIG. 7 is a side view illustrating the element body, the first electrode layer, and the second electrode layer. FIG. 8 is an end view illustrating the element body, the first electrode layer, and the second electrode layer. In the first embodiment, an electronic component is, for example, the multilayer capacitor C1.

As illustrated in FIG. 1, the multilayer capacitor C1 includes an element body 3 of a rectangular parallelepiped shape and a plurality of external electrodes 5. In the present embodiment, the multilayer capacitor C1 includes a pair of external electrodes 5. The pair of external electrodes 5 is disposed on an outer surface of the element body 3. The pair of external electrodes 5 is spaced apart from each other. The rectangular parallelepiped shape includes a rectangular parallelepiped shape in which corners and ridges are chamfered, and a rectangular parallelepiped shape in which the corners and ridges are rounded.

The element body 3 includes a pair of principal surfaces 3a and 3b opposing each other, a pair of side surfaces 3c opposing each other, and a pair of end surfaces 3e opposing each other. The pair of principal surfaces 3a and 3b and the pair of side surfaces 3c have a rectangular shape. The direction in which the pair of principal surfaces 3a and 3b opposes each other is a first direction D1. The direction in which the pair of side surfaces 3c opposes each other is a second direction D2. The direction in which the pair of end surfaces 3e opposes each other is a third direction D3. The multilayer capacitor C1 is solder-mounted on an electronic device. The electronic device includes, for example, a circuit board or an electronic component. The principal surface 3a of the multilayer capacitor C1 opposes the electronic device. The principal surface 3a is arranged to constitute a mounting surface. The principal surface 3a is the mounting surface.

The first direction D1 is a direction orthogonal to the respective principal surfaces 3a and 3b and is orthogonal to the second direction D2. The third direction D3 is a direction parallel to the respective principal surfaces 3a and 3b and the respective side surfaces 3c, and is orthogonal to the first direction D1 and the second direction D2. The second direction D2 is a direction orthogonal to the respective side surfaces 3c. The third direction D3 is a direction orthogonal to the respective end surfaces 3e. In the first embodiment, a length of the element body 3 in the third direction D3 is larger than a length of the element body 3 in the first direction D1, and larger than a length of the element body 3 in the second direction D2. The third direction D3 is a longitudinal direction of the element body 3.

The pair of side surfaces 3c extends in the first direction D1 to couple the pair of principal surfaces 3a and 3b. The pair of side surfaces 3c also extends in the third direction D3. The pair of end surfaces 3e extends in the first direction D1 to couple the pair of principal surfaces 3a and 3b. The pair of end surfaces 3e also extends in the second direction D2.

The element body 3 includes a pair of ridge portions 3g, a pair of ridge portions 3h, four ridge portions 3i, a pair of ridge portions 3j, and a pair of ridge portions 3k. The ridge portion 3g is located between the end surface 3e and the principal surface 3a. The ridge portion 3h is located between the end surface 3e and the principal surface 3b. The ridge portion 3i is located between the end surface 3e and the side surface 3c. The ridge portion 3j is located between the principal surface 3a and the side surface 3c. The ridge portion 3k is located between the principal surface 3b and the side surface 3c. In the present embodiment, each of the ridge portions 3g, 3h, 3i, 3j, and 3k is rounded to curve. The element body 3 is subject to what is called a round chamfering process.

The end surface 3e and the principal surface 3a are indirectly adjacent to each other with the ridge portion 3g therebetween. The end surface 3e and the principal surface 3b are indirectly adjacent to each other with the ridge portion 3h therebetween. The end surface 3e and the side surface 3c are indirectly adjacent to each other with the ridge portion 3i therebetween. The principal surface 3a and the side surface 3c are indirectly adjacent to each other with the ridge portion 3j therebetween. The principal surface 3b and the side surface 3c are indirectly adjacent to each other with the ridge portion 3k therebetween.

The element body 3 is configured by laminating a plurality of dielectric layers in the second direction D2. The element body 3 includes the plurality of laminated dielectric layers. In the element body 3, a lamination direction of the plurality of dielectric layers coincides with the second direction D2. Each dielectric layer includes, for example, a sintered body of a ceramic green sheet containing a dielectric material. The dielectric material includes, for example, a dielectric ceramic of $BaTiO_3$ base, $Ba(Ti,Zr)O_3$ base, or $(Ba,Ca)TiO_3$ base. In an actual element body 3, each of the dielectric layers is integrated to such an extent that a boundary between the dielectric layers cannot be visually recognized. In the element body 3, the lamination direction of the plurality of dielectric layers may coincide with the first direction D1.

As illustrated in FIGS. 2 and 3, the multilayer capacitor C1 includes a plurality of internal electrodes 7 and a plurality of internal electrodes 9. Each of the internal electrodes 7 and 9 is an internal conductor disposed in the element body 3. Each of the internal electrodes 7 and 9 is made of a conductive material that is commonly used as an internal conductor of a multilayer electronic component. The conductive material includes, for example, a base metal. The conductive material includes, for example, Ni or Cu. Each of the internal electrodes 7 and 9 is configured as a sintered body of conductive paste containing the conductive material described above. In the first embodiment, the internal electrodes 7 and 9 are made of Ni.

The internal electrodes 7 and the internal electrodes 9 are disposed in different positions (layers) in the second direction D2. The internal electrodes 7 and the internal electrodes 9 are alternately disposed in the element body 3 to oppose each other in the second direction D2 with an interval therebetween. Polarities of the internal electrodes 7 and the internal electrodes 9 are different from each other. In a case where the lamination direction of the plurality of dielectric layers is the first direction D1, the internal electrodes 7 and the internal electrodes 9 are disposed in different positions (layers) in the first direction D1. One end of each of the internal electrodes 7 and 9 is exposed to a corresponding end surface 3e. Each of the internal electrodes 7 and 9 includes one end exposed to the corresponding end surface 3e. A plurality of internal electrodes 7 and a plurality of internal electrodes 9 are alternately disposed in the second direction D2. The internal electrodes 7 and 9 are located in a plane substantially orthogonal to the principal surfaces 3a and 3b. The internal electrodes 7 and the internal electrodes 9 oppose each other in the second direction D2. The direction (second direction D2) in which the internal electrodes 7 and the internal electrodes 9 oppose each other is orthogonal to the direction (first direction D1) orthogonal to the principal surfaces 3a and 3b.

As illustrated in FIG. 2, the external electrodes 5 are disposed at both end portions of the element body 3 in the third direction D3. Each of the external electrodes 5 is disposed on the corresponding end surface 3e side of the element body 3. As illustrated in FIGS. 3, 4, and 5, the external electrode 5 includes a plurality of electrode portions 5a, 5b, 5c, and 5e. The electrode portion 5a is disposed on the principal surface 3a and on the ridge portion 3g. The electrode portion 5b is disposed on the ridge portion 3h. The electrode portion 5c is disposed on each side surface 3c and on each ridge portion 3i. The electrode portion 5e is disposed on the corresponding end surface 3e. The external electrode 5 also includes electrode portions disposed on the ridge portions 3j and 3k.

The external electrode 5 is formed on the four surfaces, that is, the principal surface 3a, the end surface 3e, and the pair of side surfaces 3c, as well as on the ridge portions 3g, 3h, 3i, and 3j. The electrode portions 5a, 5b, 5c, and 5e adjacent each other are coupled and are electrically connected to each other. In the present embodiment, the external electrode 5 is not intentionally formed on a principal surface 3b. Each electrode portion 5e disposed on each end surface 3e covers all one ends of the corresponding internal electrodes 7 or 9. Each of the internal electrodes 7 and 9 is directly connected to the corresponding electrode portion 5e. Each of the internal electrodes 7 and 9 is electrically connected to the corresponding external electrode 5.

As illustrated in FIGS. 3, 4, and 5, the external electrode 5 includes a first electrode layer E1, a second electrode layer E2, a third electrode layer E3, and a fourth electrode layer E4. The fourth electrode layer E4 is the outermost layer of the external electrode 5. Each of the electrode portions 5a, 5c, and 5e includes the first electrode layer E1, the second electrode layer E2, the third electrode layer E3, and the fourth electrode layer E4. The electrode portion 5b includes the first electrode layer E1, the third electrode layer E3, and the fourth electrode layer E4.

The first electrode layer E1 included in the electrode portion 5a is disposed on the ridge portion 3g, and is not disposed on the principal surface 3a. In the present embodiment, the first electrode layer E1 included in the electrode portion 5a is in contact with the entire ridge portion 3g. The principal surface 3a is not covered with the first electrode layer E1, thereby being exposed from the first electrode layer E1. The second electrode layer E2 included in the electrode portion 5a is disposed on the first electrode layer E1 and on the principal surface 3a. The first electrode layer E1 is entirely covered with the second electrode layer E2. In the electrode portion 5a, the second electrode layer E2 is in contact with a part of the principal surface 3a and the entire first electrode layer E1. The electrode portion 5a is four-layered on the ridge portion 3g, and is three-layered on the principal surface 3a.

As described above, in a case in which an element is described as covering another element, the element may directly cover the other element or indirectly cover the other element. In a case in which an element is described as indirectly covering another element, an intervening element is present between the element and the other element. In a case in which an element is described as directly covering another element, no intervening element is present between the element and the other element.

The second electrode layer E2 included in the electrode portion 5a is formed to cover the entire ridge portion 3g and the part of the principal surface 3a. The second electrode layer E2 included in the electrode portion 5a indirectly covers the entire ridge portion 3g in such a manner that the first electrode layer E1 is located between the second electrode layer E2 and the ridge portion 3g. The second electrode layer E2 included in the electrode portion 5a directly covers the part of the principal surface 3a. The second electrode layer E2 included in the electrode portion 5a directly covers an entire portion of the first electrode layer E1 formed on the ridge portion 3g.

The first electrode layer E1 included in the electrode portion 5b is disposed on the ridge portion 3h, and is not disposed on the principal surface 3b. In the present embodiment, the first electrode layer E1 included in the electrode portion 5b is in contact with the entire ridge portion 3h. The principal surface 3b is not covered with the first electrode layer E1, thereby being exposed from the first electrode layer E1. The electrode portion 5b does not include the second electrode layer E2. The principal surface 3b is not covered with the second electrode layer E2, thereby being exposed from the second electrode layer E2. The electrode portion 5b is three-layered.

The first electrode layer E1 included in the electrode portion 5c is disposed on the ridge portion 3i, and is not disposed on the side surface 3c. In the present embodiment, the first electrode layer E1 included in the electrode portion 5c is in contact with the entire ridge portion 3i. The side surface 3c is not covered with the first electrode layer E1, thereby being exposed from the first electrode layer E1. The second electrode layer E2 included in the electrode portion 5c is disposed on the first electrode layer E1 and on the side surface 3c. A part of the first electrode layer E1 is covered with the second electrode layer E2. In the electrode portion 5c, the second electrode layer E2 is in contact with a part of the side surface 3c and a part of the first electrode layer E1.

The second electrode layer E2 included in the electrode portion 5c is formed to cover a part of the ridge portion 3i and a part of the side surface 3c. The second electrode layer E2 included in the electrode portion 5c indirectly covers the part of the ridge portion 3i in such a manner that the first electrode layer E1 is located between the second electrode layer E2 and the ridge portion 3i. The second electrode layer E2 included in the electrode portion 5c indirectly covers a region near the principal surface 3a of the ridge portion 3i. The second electrode layer E2 included in the electrode portion 5c directly covers a part of the side surface 3c. The second electrode layer E2 included in the electrode portion 5c directly covers the part of the portion of the first electrode layer E1 formed in the ridge portion 3i.

The electrode portion 5c includes a region $5c_1$ and a region $5c_2$. The region $5c_2$ is located closer to the principal surface 3a than the region $5c_1$. In the present embodiment, the electrode portion 5c includes only two regions $5c_1$, $5c_2$. The region $5c_1$ includes the first electrode layer E1, the third electrode layer E3, and the fourth electrode layer E4. The region $5c_1$ does not include the second electrode layer E2. The region $5c_1$ is three-layered. The region $5c_2$ includes the first electrode layer E1, the second electrode layer E2, the third electrode layer E3, and the fourth electrode layer E4. The region $5c_2$ is four-layered on the ridge portion 3i, and is three-layered on the side surface 3c. The region $5c_1$ is the region where the first electrode layer E1 is exposed from the second electrode layer E2. The region $5c_2$ is the region where the first electrode layer E1 is covered with the second electrode layer E2.

The first electrode layer E1 included in the electrode portion 5e is disposed on the end surface 3e. The end surface 3e is entirely covered with the first electrode layer E1. The first electrode layer E1 included in the electrode portion 5e is in contact with the entire end surface 3e. The second electrode layer E2 included in the electrode portion 5e is disposed on the first electrode layer E1. A part of the first electrode layer E1 is covered with the second electrode layer E2. In the electrode portion 5e, the second electrode layer E2 is in contact with the part of the first electrode layer E1. The second electrode layer E2 included in the electrode portion 5e is formed to cover a part of the end surface 3e. The second electrode layer E2 included in the electrode portion 5e indirectly covers the part of the end surface 3e in such a manner that the first electrode layer E1 is located between the second electrode layer E2 and the end surface 3e. The second electrode layer E2 included in the electrode portion 5e directly covers a part of the portion of the first electrode layer E1 formed on the end surface 3e.

The electrode portion 5e includes a region $5e_1$ and a region $5e_2$. The region $5e_2$ is located closer to the principal surface 3a than the region $5e_1$. In the present embodiment, the electrode portion 5e includes only two regions $5e_1$, $5e_2$. The region $5e_1$ includes the first electrode layer E1, the third electrode layer E3, and the fourth electrode layer E4. The region $5e_1$ does not include the second electrode layer E2. The region $5e_1$ is three-layered. The region $5e_2$ includes the first electrode layer E1, the second electrode layer E2, the third electrode layer E3, and the fourth electrode layer E4. The region $5e_2$ is four-layered. The region $5e_1$ is the region where the first electrode layer E1 is exposed from the second electrode layer E2. The region $5e_2$ is the region where the first electrode layer E1 is covered with the second electrode layer E2.

The first electrode layer E1 is formed by sintering conductive paste applied onto the surface of the element body 3. The first electrode layer E1 is formed to cover the end surface 3e and the ridge portions 3g, 3h, and 3i. The first electrode layer E1 is formed by sintering a metal component (metal powder) contained in the conductive paste. The first electrode layer E1 is a sintered metal layer. The first electrode layer E1 is a sintered metal layer formed on the element body 3. The first electrode layer E1 is not intentionally formed on the pair of principal surfaces 3a and 3b and the pair of side surfaces 3c. The first electrode layer E1 may be formed on the principal surfaces 3a and 3b and the side surfaces 3c due to a manufacturing error, for example.

In the present embodiment, the first electrode layer E1 is a sintered metal layer made of Cu. The first electrode layer E1 may be a sintered metal layer made of Ni. The first electrode layer E1 contains a base metal. The conductive paste contains, for example, powder made of Cu or Ni, a glass component, an organic binder, and an organic solvent.

The second electrode layer E2 is formed by curing conductive resin applied onto the first electrode layer E1, the principal surface 3a, and the pair of side surfaces 3c. The second electrode layer E2 is formed over the first electrode layer E1 and the element body 3. The second electrode layer E2 covers a partial region of the first electrode layer E1. The second electrode layer E2 covers the regions, of the first electrode layer E1, corresponding to the electrode portion 5a, the region $5c_2$ of the electrode portion 5c, and the region $5e_2$ of the electrode portion 5e. The second electrode layer E2 directly covers the part of the ridge portion 3j. The second electrode layer is in contact with a part of the ridge portion 3j. The first electrode layer E1 serves as an underlying metal layer for forming the second electrode layer E2. The second electrode layer E2 is a conductive resin layer formed on the first electrode layer E1.

The conductive resin contains, for example, a resin, a conductive material, and an organic solvent. The resin is, for example, a thermosetting resin. The conductive material is, for example, metal powder. The metal powder is, for example, Ag powder or Cu powder. The thermosetting resin is, for example, a phenolic resin, an acrylic resin, a silicone resin, an epoxy resin, or a polyimide resin.

The third electrode layer E3 is formed on the second electrode layer E2 and on the first electrode layer E1 by plating method. The third electrode layer E3 is formed on a portion of the first electrode layer E1 exposed from the second electrode layer E2. The third electrode layer E3 directly covers the second electrode layer E2 and the portion of the first electrode layer E1 exposed from the second electrode layer E2. In the present embodiment, the third electrode layer E3 is formed on the first electrode layer E1 and the second electrode layer E2 by Ni plating. The third electrode layer E3 is a Ni plating layer. The third electrode layer E3 may be an Sn plating layer, a Cu plating layer, or an Au plating layer. The third electrode layer E3 contains Ni, Sn, Cu, or Au.

The fourth electrode layer E4 is formed on the third electrode layer E3 by plating method. The fourth electrode layer E4 indirectly covers the second electrode layer E2 and the portion of the first electrode layer E1 exposed from the second electrode layer E2 in such a manner that the third electrode layer E3 is located between the fourth electrode layer E4 and the second electrode layer E2 and portion of the first electrode layer E1 exposed from the second electrode layer E2. In the present embodiment, the fourth electrode layer E4 is formed on the third electrode layer E3 by Sn plating. The fourth electrode layer E4 is an Sn plating layer. The fourth electrode layer E4 may be a Cu plating layer or an Au plating layer. The fourth electrode layer E4 contains Sn, Cu, or Au. The third electrode layer E3 and fourth electrode layer E4 form a plating layer disposed on the second electrode layer E2. In the present embodiment, the plating layer disposed on the second electrode layer E2 is a two-layered plating layer.

The first electrode layer E1 included in the electrode portion 5a, the first electrode layer E1 included in the electrode portion 5b, the first electrode layer E1 included in the electrode portion 5c, and the first electrode layer E1 included in the electrode portion 5e are integrally formed. The second electrode layer E2 included in the electrode portion 5a, the second electrode layer E2 included in the electrode portion 5c, and the second electrode layer E2 included in the electrode portion 5e are integrally formed. The third electrode layer E3 included in the electrode portion 5a, the third electrode layer E3 included in the electrode portion 5b, the third electrode layer E3 included in the electrode portion 5c, and the third electrode layer E3 included in the electrode portion 5e are integrally formed. The fourth electrode layer E4 included in the electrode portion 5a, the fourth electrode layer E4 included in the electrode portion 5b, the fourth electrode layer E4 included in the electrode portion 5c, and the fourth electrode layer E4 included in the electrode portion 5e are integrally formed.

Each of the first electrode layers E1 (first electrode layers E1 included in the electrode portions 5e) is formed on the end surface 3e to be connected to the respective internal electrodes 7 and 9. The first electrode layer E1 covers the entire end surface 3e, the entire ridge portion 3g, the entire ridge portion 3h, and the entire ridge portion 3i. The second electrode layer E2 (second electrode layer E2 included in the electrode portions 5a, 5c, and 5e) continuously covers a part of the principal surface 3a, a part of the end surface 3e, and a part of each of the pair of side surfaces 3c. The second electrode layer E2 integrally covers a region near the end surface 3e of the principal surface 3a, a region near the principal surface 3a of the end surface 3e, and a region near the principal surface 3a of the side surface 3c.

The second electrode layer E2 (second electrode layer E2 included in the electrode portions 5a, 5c, and 5e) covers the entire ridge portion 3g, a part of the ridge portion 3i, and a part of the ridge portion 3j. The second electrode layer E2 covers the entire ridge portion 3g, the part of the ridge portion 3i, and the part of the ridge portion 3j in such a manner that the first electrode layer E1 is located between the second electrode layer E2 and the ridge portions 3g, 3i, and 3j. The second electrode layer E2 directly covers the entire portion formed on the ridge portion 3g, a part of the portion formed on the ridge portion 3i, and a part of the portion formed on the ridge portion 3j, of the first electrode layer E1. The second electrode layer E2 includes a plurality of portions each corresponding to the part of the principal surface 3a, the part of the end surface 3e, the part of each of the pair of side surfaces 3c, the entire ridge portion 3g, the part of the ridge portion 3i, and the part of the ridge portion 3j.

The first electrode layer E1 (first electrode layer E1 included in the electrode portions 5a, 5b, 5c, and 5e) includes a region covered with the second electrode layer E2 (second electrode layer E2 included in the electrode portions 5a, 5c, and 5e), and a region not covered with the second electrode layer E2 (second electrode layer E2 included in the electrode portions 5a, 5c, and 5e). The region not covered with the second electrode layer E2 is a region exposed from the second electrode layer E2. The third electrode layer E3 and the fourth electrode layer E4 cover a region of the first electrode layer E1 not covered with the second electrode layer E2 and the second electrode layer E2. The first electrode layer E1 (first electrode layer E1 included in the electrode portion 5e) is directly connected to the respective internal electrodes 7 and 9.

As illustrated in FIG. 6, when viewed from the first direction D1, the entire portion of the first electrode layer E1 (first electrode layer E1 included in the electrode portion 5a) is covered with the second electrode layer E2. When viewed from the first direction D1, the first electrode layer E1 (first electrode layer E1 included in the electrode portion 5a) is not exposed from the second electrode layer E2.

As illustrated in FIG. 7, when viewed in the second direction D2, the end region near the principal surface 3a of the first electrode layer E1 is covered with the second electrode layer E2. The end region near the principal surface 3a of the first electrode layer E1 includes the first electrode layer E1 included in the region $5c_2$. When viewed from the second direction D2, the end edge E2e of the second electrode layer E2 crosses the end edge E1e of the first electrode layer E1. When viewed from the second direction D2, the end region near the principal surface 3b of the first electrode layer E1 is exposed from the second electrode layer E2. The end region near the principal surface 3b of the first electrode layer E1 includes the first electrode layer E1 included in the region $5c_1$. An area of the second electrode layer E2 located on the side surface 3c and the ridge portion 3i is larger than an area of the first electrode layer E1 located on the ridge portion 3i.

As illustrated in FIG. 8, when viewed from the third direction D3, the end region near the principal surface 3a of the first electrode layer E1 is covered with the second electrode layer E2. The end region near the principal surface 3a of the first electrode layer E1 includes the first electrode layer E1 included in the region $5e_2$. When viewed from the third direction D3, the end edge E2e of the second electrode layer E2 is located on the first electrode layer E1. When viewed from the third direction D3, the end region near the principal surface 3b of the first electrode layer E1 is exposed from the second electrode layer E2. The end region near the principal surface 3b of the first electrode layer E1 includes the first electrode layer E1 included in the region $5e_1$. An area of the second electrode layer E2 located on the end surface 3e and the ridge portion 3g is smaller than an area of the first electrode layer E1 located on the end surface 3e and the ridge portion 3g.

In the present embodiment, the second electrode layer E2 continuously covers only the part of the principal surface 3a, only the part of the end surface 3e, and only the part of each of the pair of side surfaces 3c. The second electrode layer E2 covers the entire ridge portion 3g, only the part of the ridge portion 3i, and only the part of the ridge portion 3j. The part of a portion, of the first electrode layer E1, covering the ridge portion 3i is exposed from the second electrode layer E2. For example, the first electrode layer E1 included in the region $5c_1$ is exposed from the second electrode layer E2.

As illustrated in FIG. 2, a width of the region $5c_2$ in a third direction D3 decreases with an increase in distance from the principal surface 3a. The width of the region $5c_2$ in a third direction D3 decreases with an increase in distance from the electrode portion 5a. A width of the region $5c_2$ in a first direction D1 decreases with an increase in distance from the end surface 3e. The width of the region $5c_2$ in a first direction D1 decreases with an increase in distance from the electrode portion 5e. In the present embodiment, an end edge of the region $5c_2$ has a substantially arc shape when viewed from a second direction D2. The region $5c_2$ has a substantially fan shape when viewed from a second direction D2. In the present embodiment, as illustrated in FIG. 7, the width of the second electrode layer E2 viewed from the second direction D2 decreases with an increase in distance from the principal surface 3a. An end edge E2e of the second electrode layer E2 has a substantially arc shape.

As illustrated in FIG. 8, when viewed from the third direction D3, a height of the second electrode layer E2 in the first direction D1 is larger at the end in the second direction D2 than at the center in the second direction D2. The height of the second electrode layer E2 in the first direction D1 is, when viewed from the third direction D3, the height to the end edge E2e of the second electrode layer E2 in the first direction D1 with reference to the position of the end edge E2f of the second electrode layer E2. Hereinafter, the height of the second electrode layer E2 in the first direction D1 is simply referred to as the "height of the second electrode layer E2". The end edge E2f of the second electrode layer E2 is defined by the surface of the second electrode layer E2 located near the principal surface 3a in the first direction D1 when viewed from the third direction D3. The center of the second electrode layer E2 in the second direction D2 is a position equivalently distanced from the pair of end edges E2g of the second electrode layer E2 in the second direction D2. The pair of end edges E2g is defined by the surface of the second electrode layer E2 each positioned near the side surface 3c in the second direction D2 when viewed from the third direction D3. The end of the second electrode layer E2 in the second direction D2 is a position nearer to the end edges E2g in the second direction D2 from the center in the second direction D2. "Equivalent" does not necessarily only mean that values are consistent. Even if values include a slight difference in a predetermined range, measurement error, or the like, the values may be defined to be equal.

In FIG. 8, the outer shape of the end surface 3e viewed from the third direction D3 is indicated by a dash-dotted line. The outer shape of the end surface 3e is defined by the boundary between the ridge portions 3g, 3i and the end surface 3e. The second electrode layer E2 includes a center portion E2c, a boundary portion E2d, and an end edge portion E2i when viewed from the third direction D3. The center portion E2c is located in the center in the second direction D2. The boundary portion E2d is located on the boundary between the end surface 3e and the ridge portion 3i. The end edge portion E2i covers the ridge portion 3i and is located on the ridge portion 3i. A height Tb of the second electrode layer E2 at the boundary portion E2d and a height Tc of the second electrode layer E2 at the end edge portion E2i are both larger than a height Ta of the second electrode layer E2 at the center portion E2c. The height Tc is larger than the height Tb. The height of the second electrode layer E2 increases sequentially from the center portion E2c to the boundary portion E2d and then to the end edge portion E2i. The second electrode layer E2 has the largest height at the end edge E2g when viewed from the third direction.

Like the height of the second electrode layer E2, a height of the portion of the second electrode layer E2 covering the end surface 3e in the first direction D1 is larger at an end in the second direction D2 than at a center in the second direction D2. Hereinafter, a portion of the second electrode layer E2 covering the end surface 3e is simply referred to as an "end surface covering portion". The height of the end surface covering portion in the first direction D1 is the height to the end edge E2e in the first direction D1 with reference to the boundary position between the ridge portion 3g and the end surface 3e. A height $Tb_e$ of a portion corresponding to the boundary portion E2d in the end surface covering portion is larger than a height $Ta_c$ of the portion corresponding to the center portion E2c of the end surface covering portion. In FIG. 8, for the sake of convenience, the position of the height $Ta_c$ is displaced from the position of the height Ta in the second direction D2, but the position of the height $Ta_c$ actually coincides with the position of the height Ta. Similarly, in FIG. 8, the position of the height $Tb_e$ is displaced from the position of the height Tb in the second direction D2, but the position of the height $Tb_e$ actually coincides with the position of the height Tb.

The height of the second electrode layer E2 gradually increases from the center toward the end in the second direction D2. The end edge E2e of the second electrode layer E2 is located away from the end edge E2f when approaching the end edge E2g from the center in the second direction D2. The end edge E2e of the second electrode layer E2 is substantially arcuate when viewed from the third direction D3. The end edge E2e of the second electrode layer E2 has a concave curve shape curved in a direction from the principal surface 3b toward the principal surface 3a when viewed from the third direction.

A length of the region of the first electrode layer E1 exposed from the second electrode layer E2 in the first direction D1 is smaller at an end in the second direction D2 than at a center in the second direction D2. Hereinafter, a region exposed from the second electrode layer E2 is simply referred to as an "exposed region". The length of the exposed region of the first electrode layer E1 is the distance in the first direction D1 from the end edge E1f of the first electrode layer E1 to the end edge E2e of the second electrode layer E2 when viewed from the third direction D3. The end edge E1f of the first electrode layer E1 is defined by the surface of the first electrode layer E1 located near the principal surface 3b in the first direction D1 when viewed from the third direction D3. The center of the first electrode layer E1 in the second direction D2 is a position equivalently distanced from the pair of end edges E1g of the first electrode layer E1 in the second direction D2. The pair of end edges E1g is defined by the surface of the first electrode layer E1 located near the side surface 3c in the second direction D2 when viewed from the third direction D3. The end in the second direction D2 of the first electrode layer E1 is a position near the end edge E1g in the second direction D2 than in the center in the second direction D2.

The length of the exposed region of the first electrode layer E1 gradually decreases from the center toward the end in the second direction D2. The end edge E1h of the exposed region of the first electrode layer E1 is located near the end edge E1f when approaching the end edge E1g from the center in the second direction D2. The end edge E1h of the exposed region of the first electrode layer E1 is substantially arcuate when viewed from the third direction D3. The end edge E1h of the exposed region of the first electrode layer E1 is also in a convex curved shape curved in a direction from the principal surface 3b toward the principal surface 3a when viewed from the third direction D3.

As described above, in the first embodiment, when viewed from the third direction D3, the height of the second electrode layer E2 in the first direction D1 is larger at the end in the second direction D2 than at the center in the second direction D2. Therefore, the second electrode layer E2 tends not to peel off from the element body 3. The multilayer capacitor C1 includes few paths through which moisture infiltrates, as compared with a configuration in which the second electrode layer E2 covers the entire end surface 3e. Therefore, the multilayer capacitor C1 has an improved moisture resistance reliability. Consequently, in the multilayer capacitor C1, the electrode layer E2 tends not to peel off from the element body and the moisture resistance reliability is improved.

In the multilayer capacitor C1, the height Tc of the second electrode layer E2 at the end edge portion E2i is larger than the height Ta of the second electrode layer E2 at the center portion E2c. Therefore, the second electrode layer E2 further tends not to peel off from the element body 3.

In a case where the multilayer capacitor C1 is solder-mounting on the electronic device, an external force applied onto the multilayer capacitor C1 from the electronic device may act as a stress on the element body. The external force acts on the element body 3 from the solder fillet formed at the solder-mounting, through the external electrode 5. The external force tends to act on the region near the end surface 3e of the principal surface 3a of the element body 3. In the configuration in which the second electrode layer E2 covers the region near the end surface 3e of the principal surface 3a, the external force applied onto the multilayer capacitor C1 from the electronic device tends not to act on the element body 3. Therefore, the multilayer capacitor C1 suppresses occurrence of a crack in the element body 3.

The second electrode layer E2 integrally covers the region near the end surface 3e of the principal surface 3a, the region near the principal surface 3a of the end surface 3e, and the region near the principal surface 3a of the side surface 3c. Therefore, the second electrode layer E2 reliably tends not to peel off from the end surface 3e, and the external force applied onto the multilayer capacitor C1 from the electronic device reliably tends not to act on the element body 3.

The region $5c_2$ of the electrode portion 5c includes the second electrode layer E2. Therefore, the stress tends not to concentrate on the end edge of the external electrode 5 even in the case where the external electrode 5 includes the electrode portion 5c. The end edge of the external electrode 5 tends not to serve as an origination of a crack.

Consequently, the multilayer capacitor C1 reliably suppresses the occurrence of a crack in the element body 3.

The region $5e_2$ of the electrode portion $5e$ includes the second electrode layer E2. Therefore, the stress tends not to concentrate on the end edge of the external electrode 5 even in the case where the external electrode 5 includes the electrode portion $5e$. For example, the stress tends not to concentrate on an end edge of a portion located near to the principal surface $3a$, within the external electrode 5. Consequently, the multilayer capacitor C1 reliably suppresses the occurrence of a crack in the element body 3.

The external electrode 5 includes the first electrode layer E1 formed on the end surface $3e$ to be connected to the respective internal electrodes 7 and 9. The first electrode layer E1 includes the region covered with the second electrode layer E2 and the region exposed from the second electrode layer E2. The first electrode layer E1 is favorably in contact with the respective internal electrodes 7 and 9. This allows reliable electrical connection between the external electrode 5 and the internal electrodes 7 and 9.

The electric resistance of the second electrode layer E2 is larger than electric resistance of the first electrode layer E1. In the multilayer capacitor C1, the region of the first electrode layer E1 exposed from the second electrode layer E2 is electrically connected to the electronic device without passing through the second electrode layer E2. Therefore, the multilayer capacitor C1 suppresses an increase of ESR even in a case where the external electrode 5 includes the second electrode layer E2.

The bonding strength between the second electrode layer E2 and the element body 3 is smaller than the bonding strength between the second electrode layer E2 and the first electrode layer E1. Therefore, the second electrode layer E2 may peel off from the element body 3.

In the multilayer capacitor C1, the second electrode layer E2 covers the part of the portion of the first electrode layer E1 formed on the ridge portion $3i$ and the entire portion of the first electrode layer E1 formed on the ridge portion $3g$. Therefore, in the multilayer capacitor C1, even in a case where the second electrode layer E2 peels off from the element body 3, the peel-off of the second electrode layer E2 tends not to develop to a position corresponding to the end surface $3e$ beyond a position corresponding to the ridge portions $3i$ and $3g$.

In the multilayer capacitor C1, the external electrode 5 includes the third electrode layer E3 and fourth electrode layer E4. Therefore, the multilayer capacitor C1 can be solder-mounting on an electronic device.

The region of the first electrode layer E1 exposed from the second electrode layer E2 is electrically connected to the electronic device via the third electrode layer E3 and fourth electrode layer E4. Therefore, the multilayer capacitor C1 further suppresses the increase in the ESR.

Figure 9:
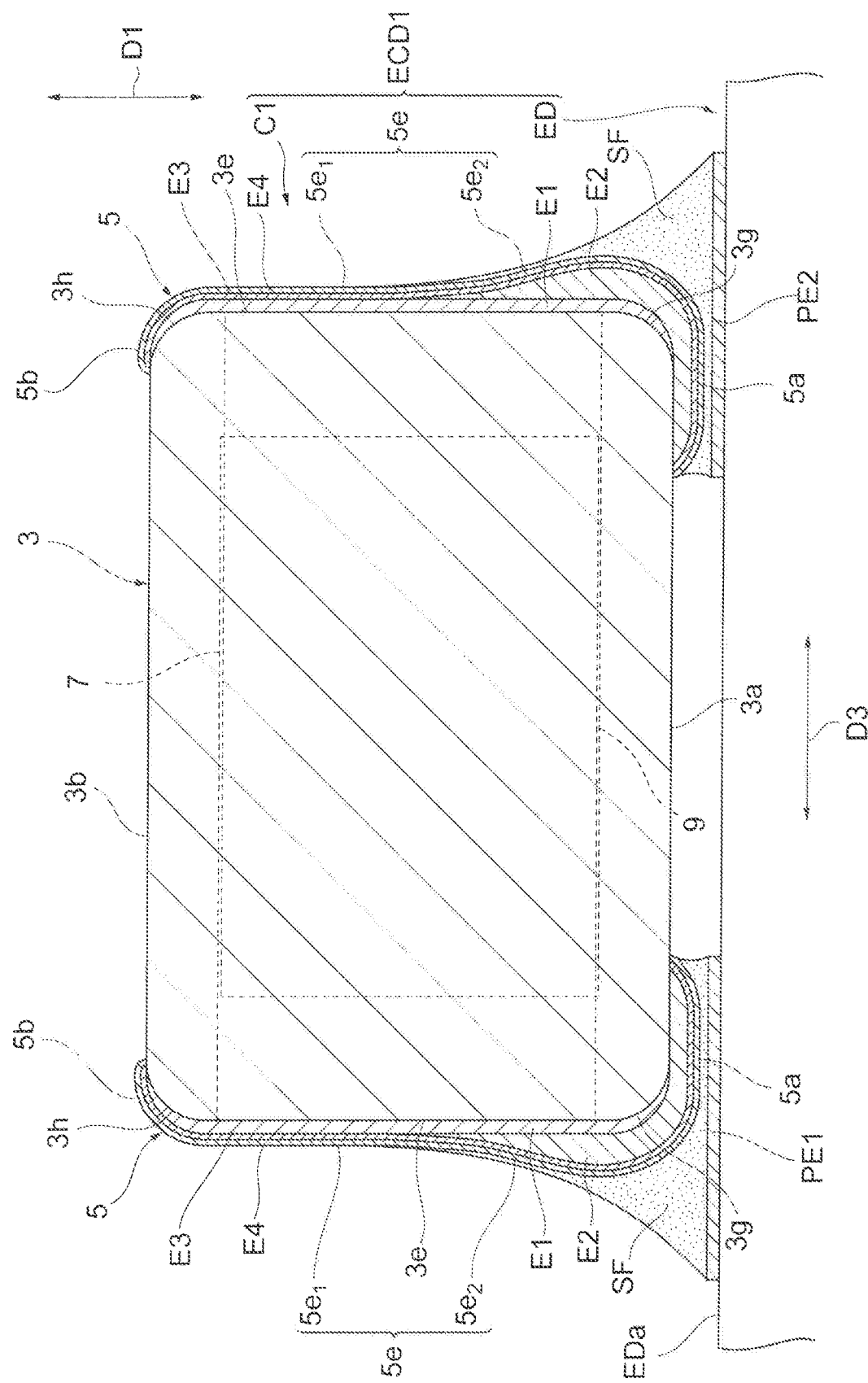
FIG. 9 is a view illustrating a mounted structure of the multilayer capacitor according to the first embodiment.

Next, a mounted structure of the multilayer capacitor C1 will be described with reference to FIG. 9. FIG. 9 is a view illustrating a mounted structure of a multilayer capacitor according to the first embodiment.

As illustrated in FIG. 9, an electronic component device ECD1 includes the multilayer capacitor C1 and an electronic device ED. The electronic device ED includes, for example, a circuit board or an electronic component.

The multilayer capacitor C1 is solder-mounted on the electronic device ED. The electronic device ED includes a principal surface EDa and a plurality of pad electrodes PE1 and PE2. In the present embodiment, the electronic device ED includes two pad electrodes PE1 and PE2. Each of the pad electrodes PE1 and PE2 is disposed on the principal surface EDa. The two pad electrodes PE1 and PE2 are spaced apart from each other. The multilayer capacitor C1 is disposed on the electronic device ED in such a manner that the principal surface $3a$ and the principal surface EDa oppose each other. As described above, the principal surface $3a$ is arranged to constitute a mounting surface.

When the multilayer capacitor C1 is solder-mounted, molten solder wets to the external electrodes 5 (fourth electrode layer E4).

Solder fillets SF are formed on the external electrodes 5 by solidification of the wet solder. The external electrodes 5 and the pad electrodes PE1 and PE2 corresponding to each other are coupled via the solder fillets SF.

The solder fillet SF is formed on the regions $5e_1$ and $5e_2$ of the electrode portion $5e$. That is, in addition to the region $5e_2$, the region $5e_1$ that does not include the second electrode layer E2 is also coupled to pad electrodes PE1 and PE2 via the solder fillet SF. Although illustration is omitted, the solder fillet SF is also formed on the regions $5c_1$ and $5c_2$ of the electrode portion $5c$. The solder fillet SF overlaps the region of the first electrode layer E1 exposed from the second electrode layer E2 when viewed from the third direction D3. The height of the solder fillet SF in the first direction D1 is larger than the height of the second electrode layer E2 in the first direction D1. The solder fillet SF extends closer to the principal surface $3b$ beyond the end edge E2$e$ of the second electrode layer E2 in the first direction D1.

In the electronic component device ECD1, as described above, the electrode layer E2 tends not to peel off from the element body and the moisture resistance reliability is improved.

When viewed from the third direction D3, the solder fillet SF overlaps the region of the first electrode layer E1 exposed from the second electrode layer E2. The region of the first electrode layer E1 exposed from the second electrode layer E2 is electrically connected to the electronic device ED via the solder fillet SF. The region of the first electrode layer E1 exposed from the second electrode layer E2 is electrically connected to the electronic device ED without passing through the second electrode layer E2. Therefore, the electronic component device ECD1 suppresses the increase of the ESR even in a case where the external electrode 5 includes the second electrode layer E2.

Second Embodiment

Figure 10:
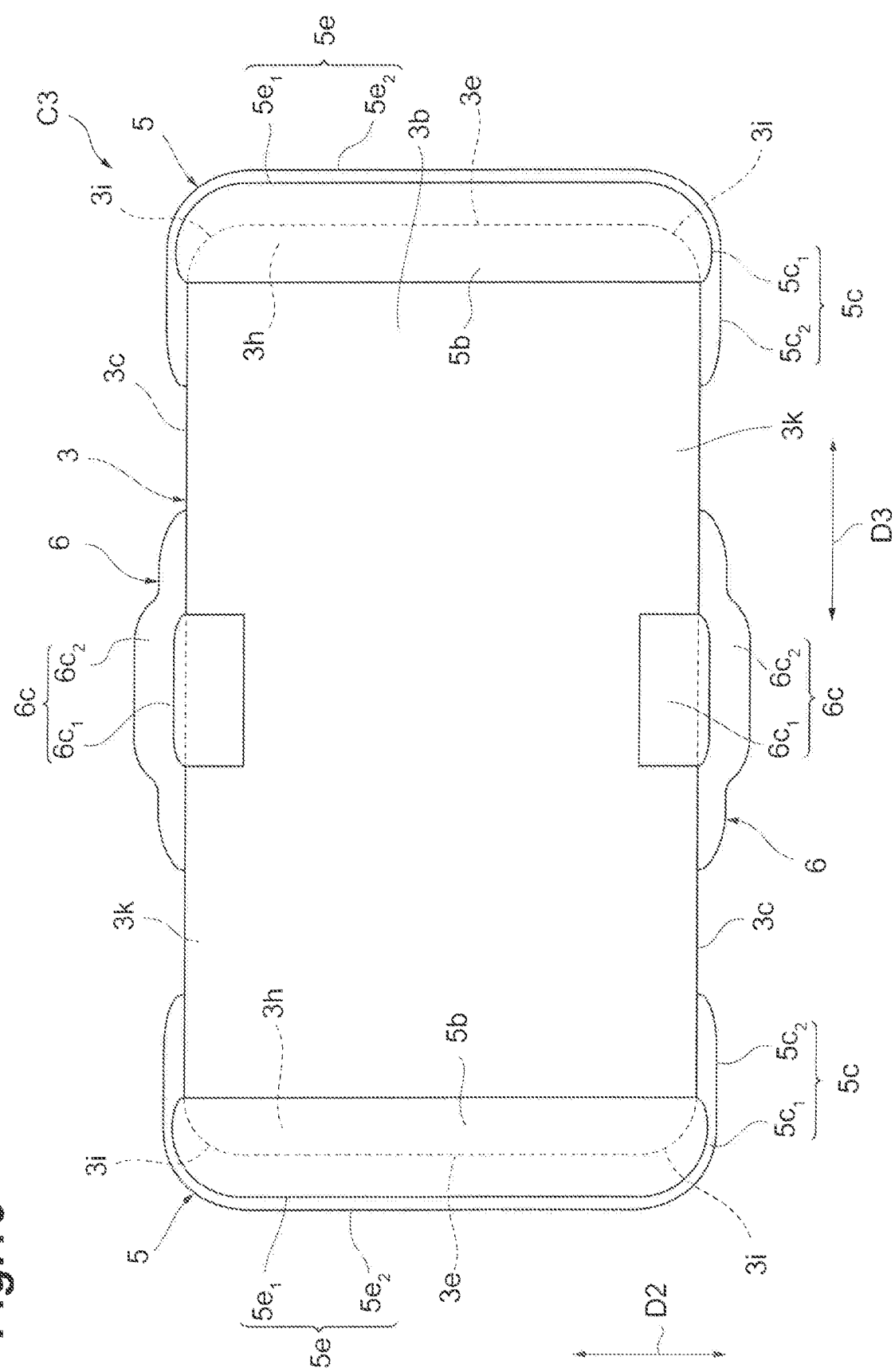
FIG. 10 is a plan view of a multilayer feedthrough capacitor according to a second embodiment.
Figure 11:
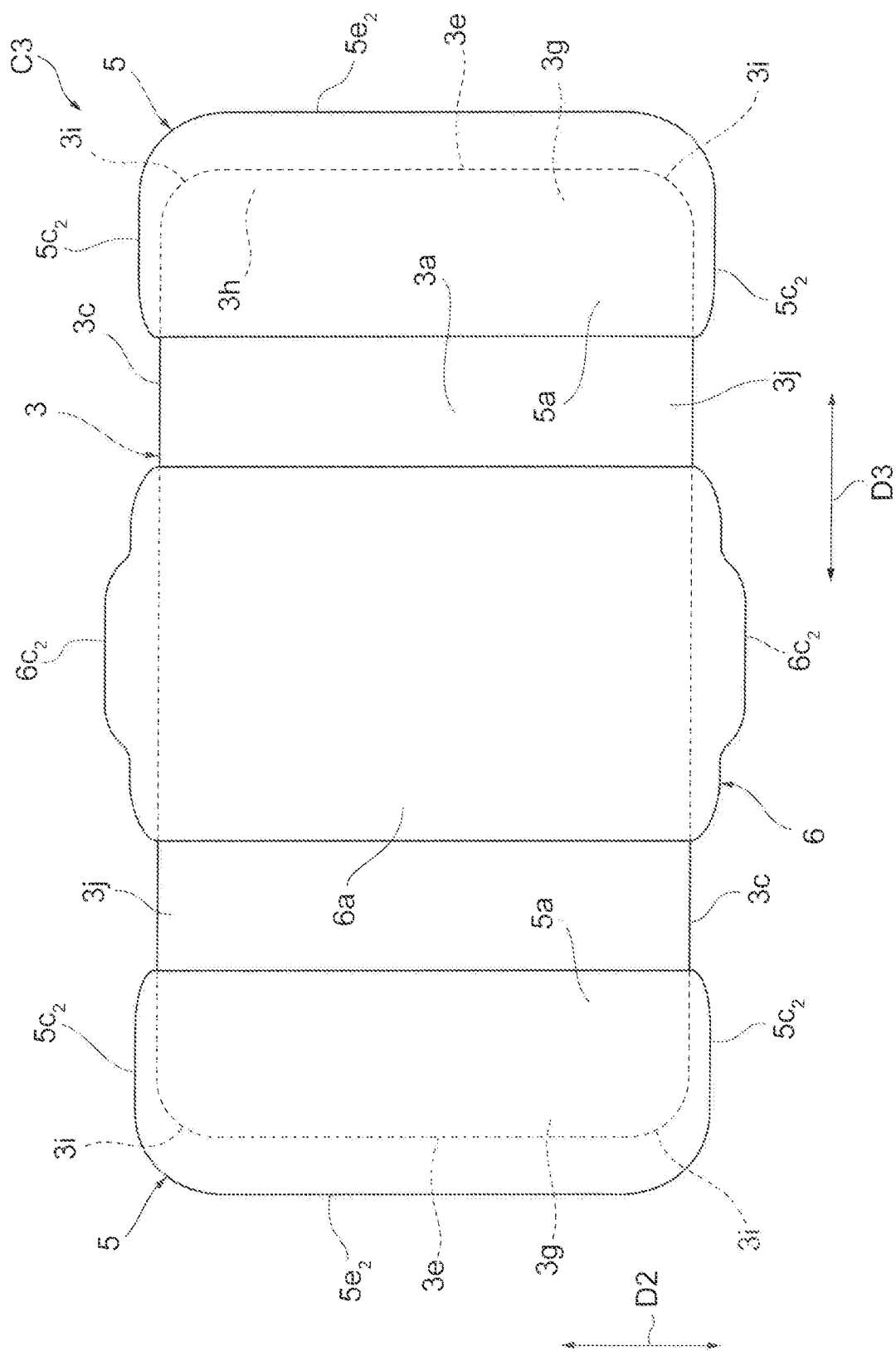
FIG. 11 is a plan view of the multilayer feedthrough capacitor according to the second embodiment.
Figure 12:
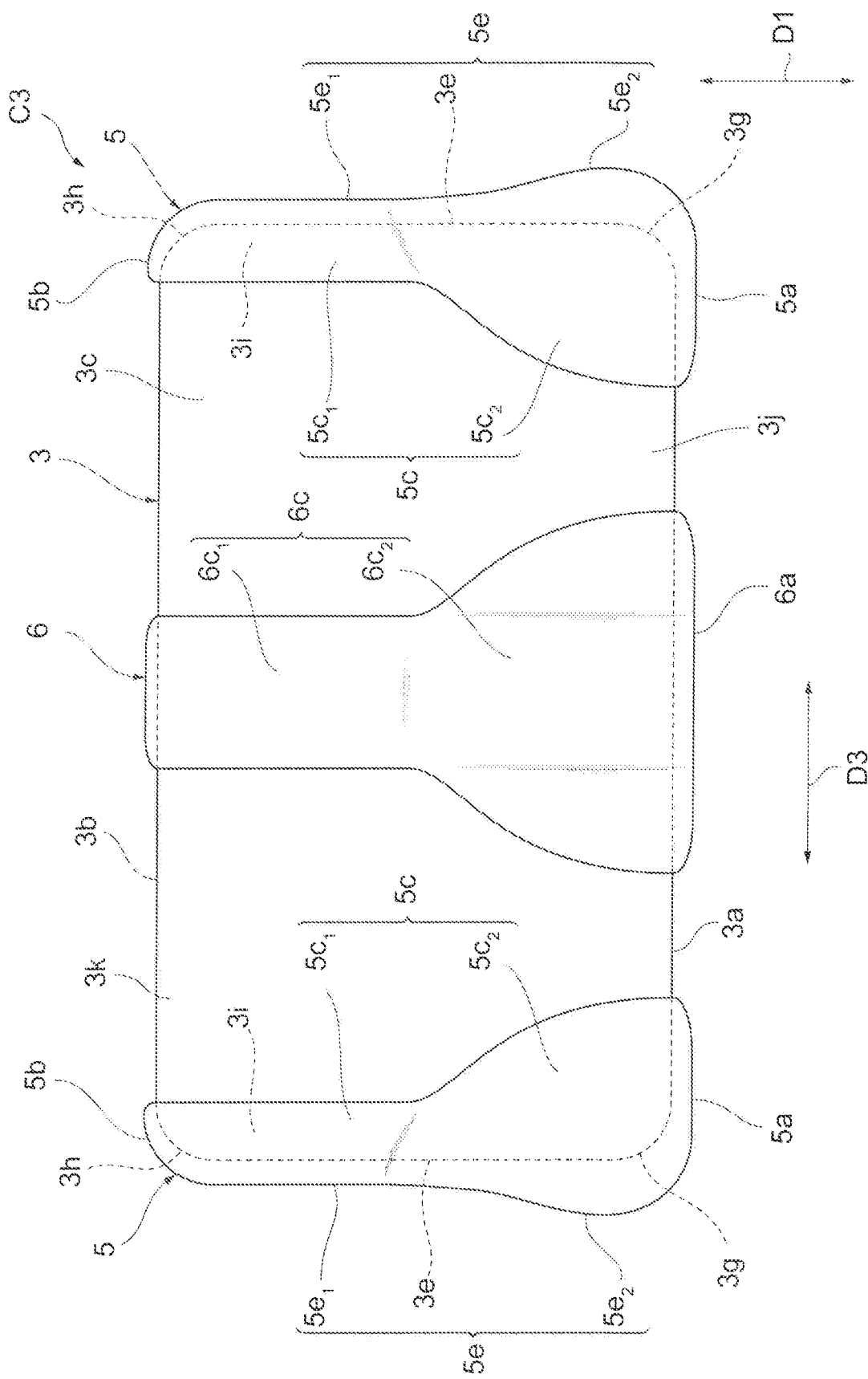
FIG. 12 is a side view of the multilayer feedthrough capacitor according to the second embodiment.
Figure 13:
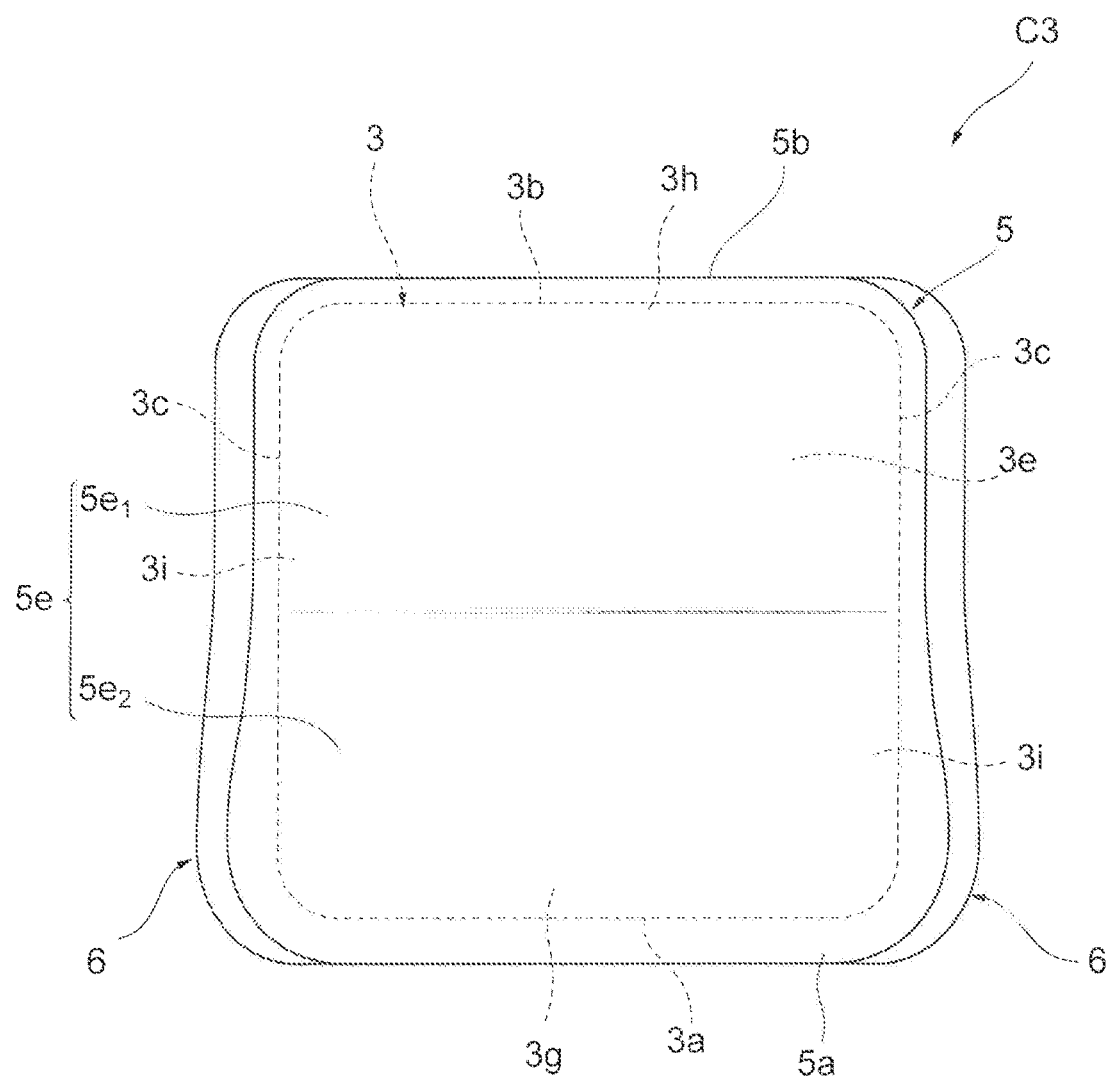
FIG. 13 is an end view of the multilayer feedthrough capacitor according to the second embodiment.
Figure 14:
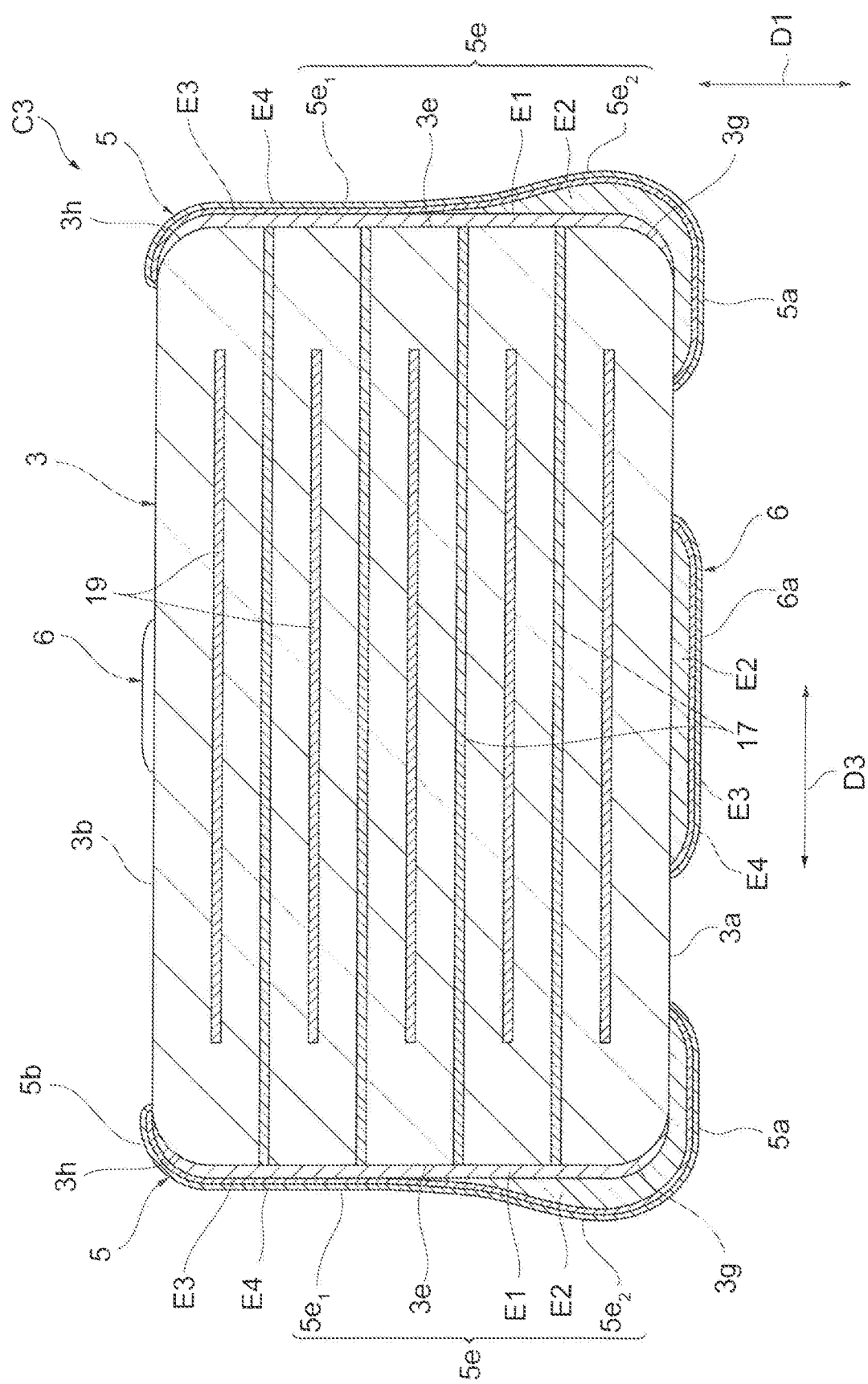
FIG. 14 is a view illustrating a cross-sectional configuration of the multilayer feedthrough capacitor according to the second embodiment.
Figure 15:
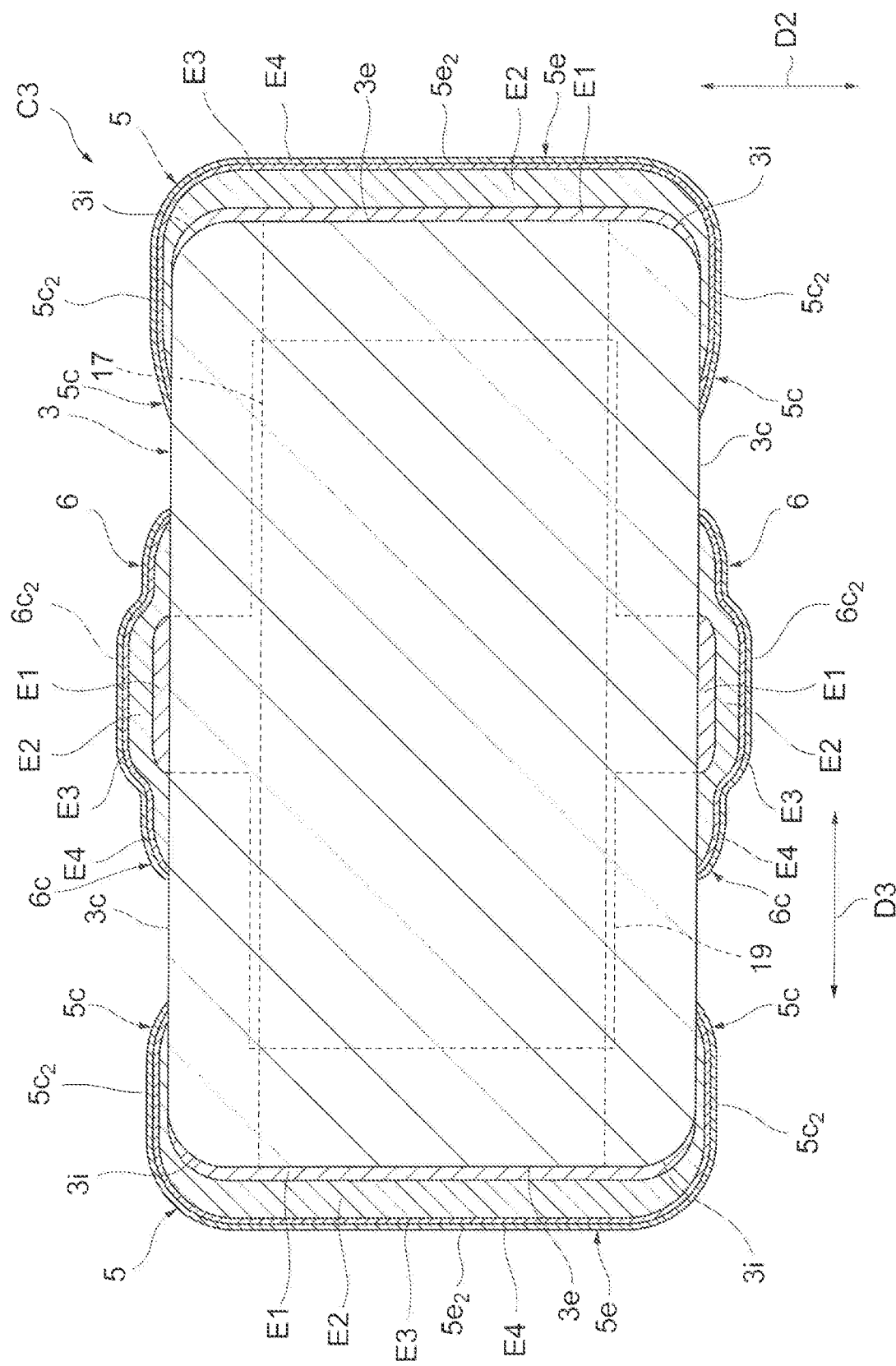
FIG. 15 is a view illustrating a cross-sectional configuration of the multilayer feedthrough capacitor according to the second embodiment.
Figure 16:
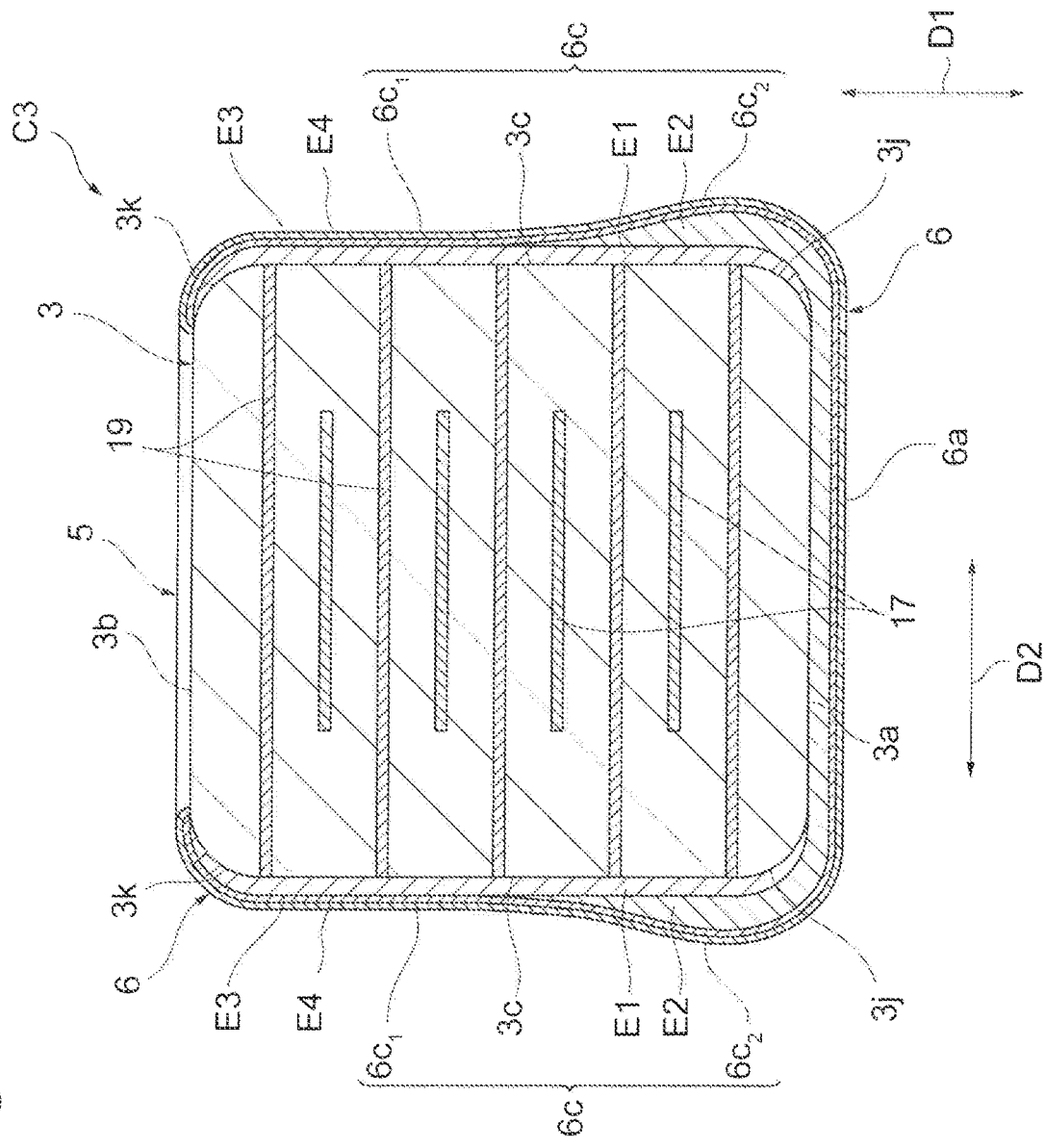
FIG. 16 is a view illustrating a cross-sectional configuration of the multilayer feedthrough capacitor according to the second embodiment.

With reference to FIGS. 10 to 17, a configuration of a multilayer feedthrough capacitor C3 according to a second embodiment will be described. FIGS. 10 and 11 are plan views of the multilayer feedthrough capacitor according to the second embodiment. FIG. 12 is a side view of the multilayer feedthrough capacitor according to the second embodiment. FIG. 13 is an end view of the multilayer feedthrough capacitor according to the second embodiment. FIGS. 14, 15, and 16 are views illustrating a cross-sectional configuration of the multilayer feedthrough capacitor according to the second embodiment. FIG. 17 is a side view illustrating an element body, a first electrode layer, and a second electrode layer. In the second embodiment, an electronic component is, for example, the multilayer feedthrough capacitor C3. Hereinafter, differences between the multilayer capacitor C1 and the multilayer feedthrough capacitor C3 will be mainly described.

As illustrated in FIGS. 10 to 13, the multilayer feedthrough capacitor C3 includes an element body 3, a pair of external electrodes 5, and one external electrode 6. The pair of external electrodes 5 and the one external electrode 6 are disposed on an outer surface of the element body 3. In the present embodiment, the element body 3 is configured by laminating a plurality of dielectric layers in the first direction D1. The pair of external electrodes 5 and the one external electrode 6 are separated from each other. The pair of external electrodes 5 is arranged to constitute signal terminal electrodes, and the external electrode 6 is arranged to constitute a ground terminal electrode.

As illustrated in FIGS. 14, 15, and 16, the multilayer feedthrough capacitor C3 includes a plurality of internal electrodes 17 and a plurality of internal electrodes 19. Each of the internal electrodes 17 and 19 is an internal conductor disposed in the element body 3. As with the internal electrodes 7 and 9, each of the internal electrodes 17 and 19 is made of a conductive material that is commonly used as an internal electrode of a multilayer electronic component. Also in the second embodiment, each of the internal electrodes 17 and 19 is made of Ni.

The internal electrode 17 and the internal electrode 19 are disposed in different positions (layers) in the first direction D1. The internal electrode 17 and the internal electrode 19 are alternately disposed in the element body 3 to oppose each other in the first direction D1 with an interval therebetween. Polarities of the internal electrode 17 and the internal electrode 19 are different from each other. In a case where a lamination direction of the plurality of dielectric layers is a second direction D2, the internal electrode 17 and the internal electrode 19 are disposed in different positions (layers) in the second direction D2. An end of the internal electrode 17 is exposed to a pair of end surfaces 3e. An end of the internal electrode 19 is exposed to a pair of side surfaces 3c.

As with the external electrodes 5 of the multilayer capacitor C1, the external electrodes 5 are disposed at both end portions of the element body 3 in a third direction D3. Each of the external electrodes 5 is disposed on the corresponding end surface 3e side of the element body 3. The external electrode 5 includes a plurality of electrode portions 5a, 5b, 5c, and 5e. The electrode portion 5a is disposed on the principal surface 3a and on the ridge portion 3g. The electrode portion 5b is disposed on the ridge portion 3h. The electrode portion 5c is disposed on each side surface 3c and on each ridge portion 3i. The electrode portion 5e is disposed on the corresponding end surface 3e. The external electrode 5 also includes a electrode portion disposed on the ridge portions 3j.

The electrode portion 5e covers all the ends exposed to the end surface 3e, of the internal electrode 17. The internal electrodes 17 are directly connected to each electrode portion 5e. The internal electrodes 17 are electrically connected to the pair of external electrodes 5.

The external electrode 6 is disposed on a central portion of the element body 3 in the third direction D3. The external electrode 6 is located between the pair of external electrode 5 in the third direction D3. The external electrode 6 includes an electrode portion 6a and a pair of electrode portions 6c. The electrode portion 6a is disposed on the principal surface 3a. Each of the electrode portions 6c is disposed on the side surface 3c and on the ridge portions 3j and 3k. The external electrode 6 is formed on the three surfaces, that is, the principal surface 3a and the pair of side surfaces 3c, as well as on the ridge portions 3j and 3k. The electrode portions 6a and 6c adjacent each other are coupled and are electrically connected to each other.

The electrode portion 6c covers all the ends exposed to the side surface 3c, of the internal electrode 19. The internal electrodes 19 are directly connected to each electrode portion 6c. The internal electrodes 19 are electrically connected to the one external electrode 6.

As illustrated in FIGS. 14, 15, and 16, the external electrode 6 includes a first electrode layer E1, a second electrode layer E2, a third electrode layer E3, and a fourth electrode layer E4. The fourth electrode layer E4 is the outermost layer of the external electrode 6. The electrode portion 6a includes the second electrode layer E2, the third electrode layer E3, and the fourth electrode layer E4. Each of the electrode portions 6c includes the first electrode layer E1, the second electrode layer E2, the third electrode layer E3, and the fourth electrode layer E4.

The first electrode layer E2 included in the electrode portion 6a is disposed on the principal surface 3a. The electrode portion 6a does not include the first electrode layer E1. The first electrode layer E2 included in the electrode portion 6a is in contact with the principal surface 3a. The electrode portion 6a is three-layered.

The first electrode layer E1 included in the electrode portion 6c is disposed on the side surface 3c and on the ridge portions 3j and 3k. The first electrode layer E2 included in the electrode portion 6c is disposed on the first electrode layer E1, on the side surface 3c, and on the ridge portion 3j. A part of the first electrode layer E1 is covered with the second electrode layer E2. The first electrode layer E2 included in the electrode portion 6c is in contact with the side surface 3c and the ridge portion 3j.

The electrode portion 6c includes a region $6c_1$ and a region $6c_2$. The region $6c_2$ is located closer to the principal surface 3a than the region $6c_1$. The region $6c_1$ includes the first electrode layer E1, the third electrode layer E3, and the fourth electrode layer E4. The region $6c_1$ does not include the second electrode layer E2. The region $6c_1$ is three-layered. The region $6c_2$ includes the first electrode layer E1, the second electrode layer E2, the third electrode layer E3, and the fourth electrode layer E4. The region $6c_2$ is four-layered. The region $6c_1$ is the region where the first electrode layer E1 is exposed from the second electrode layer E2. The region $6c_2$ is the region where the first electrode layer E1 is covered with the second electrode layer E2.

The first electrode layer E1 is formed to cover the side surface 3c and the ridge portion 3j and 3k. The first electrode layer E1 is not intentionally formed on the pair of principal surfaces 3a and 3b. The first electrode layer E1 may be formed on the principal surfaces 3a and 3b due to a manufacturing error, for example.

The second electrode layer E2 is formed over the first electrode layer E1 and the element body 3. The second electrode layer E2 covers a partial region of the first electrode layer E1. The second electrode layer E2 covers a region corresponding to the region $6c_2$ of the electrode portion 6c. The second electrode layer E2 covers a partial region of the principal surface 3a, a partial region of the side surface 3c, and a partial region of the ridge portion 3j.

The third electrode layer E3 is formed on the second electrode layer E2 and on the first electrode layer E1 by plating method. The third electrode layer E3 is formed on a portion of the first electrode layer E1 exposed from the second electrode layer E2. The fourth electrode layer E4 is formed on the third electrode layer E3 by plating method.

The second electrode layer E2 included in the electrode portion 6a and the second electrode layer E2 included in the electrode portion 6c are integrally formed. The third electrode layer E3 included in the electrode portion 6a and the third electrode layer E3 included in the electrode portion 6c are integrally formed. The fourth electrode layer E4 included in the electrode portion 6a and the fourth electrode layer E4 included in the electrode portion 6 are integrally formed.

With regard to the external electrode 6, as illustrated in FIG. 17, when viewed in the second direction D2, the end region near the principal surface 3a of the first electrode layer E1 is covered with the second electrode layer E2. The end region near the principal surface 3a of the first electrode layer E1 includes the first electrode layer E1 included in the region $6c_2$. When viewed from the second direction D2, the end edge E2e of the second electrode layer E2 crosses the end edge E1e of the first electrode layer E1. When viewed from the second direction D2, the end region near the principal surface 3b of the first electrode layer E1 is exposed from the second electrode layer E2. The end region near the principal surface 3b of the first electrode layer E1 includes the first electrode layer E1 included in the region $6c_1$.

As illustrated in FIG. 12, a width of the region $6c_2$ in a third direction D3 decreases with an increase in distance from the principal surface 3a. The width of the region $5c_2$ in a third direction D3 decreases with an increase in distance from the electrode portion 6a. In the present embodiment, an end edge of the region $6c_2$ has a substantially arc shape when viewed from a second direction D2. The region $6c_2$ has a substantially semicircular shape when viewed from a second direction D2. In the present embodiment, as illustrated in FIG. 17, the width of the second electrode layer E2 viewed from the second direction D2 decreases with an increase in distance from the principal surface 3a. An end edge E2e of the second electrode layer E2 included in the region $6c_2$ has a substantially arc shape.

The multilayer feedthrough capacitor C3 is also solder-mounted on the electronic device. In the multilayer feedthrough capacitor C3, the principal surface 3a opposes the electronic device. The principal surface 3a is arranged to constitute a mounting surface.

The configuration of the external electrode 5, when viewed from the third direction D3, is the same as the configuration of the external electrode 5 of the first embodiment. In the second embodiment, when viewed from the third direction D3, the height of the second electrode layer E2 included in the external electrode 5 in the first direction D1 is also larger at an end in the second direction D2 than at a center in the second direction D2. Like the multilayer capacitor C1, therefore, the second electrode layer E2 tends not to peel off from the element body 3 and moisture resistance reliability is improved in the multilayer feedthrough capacitor C3. In the second embodiment, illustration of the configuration of the external electrode 5 when viewed from the third direction D3 is omitted.

In the multilayer feedthrough capacitor C3, when viewed in the second direction D2, the end region near the principal surface 3a of the first electrode layer E1 is covered with the second electrode layer E2 with regard to the external electrode 6. Therefore, the stress tends not to concentrate on the end edge of the first electrode layer E1 included in the region $6c_2$. Consequently, the multilayer feedthrough capacitor C3 suppresses occurrence of a crack in the element body 3.

In the region $6c_1$ of the electrode portion 6c, the first electrode layer E1 is exposed from the second electrode layer E2. The region $6c_1$ does not include the second electrode layer E2. In region $6c_1$, the first electrode layer E1 is electrically connected to the electronic device without passing through the second electrode layer E2. Therefore, the multilayer feedthrough capacitor C3 suppresses an increase of ESR.

The region $6c_2$ of the electrode portion 6c includes the second electrode layer E2. Therefore, the stress tends not to concentrate on the end edge of the external electrode 6 even in the case where the external electrode 6 includes the electrode portion 6c. The end edge of the external electrode 6 tends not to serve as an origination of a crack. Consequently, the multilayer feedthrough capacitor C3 reliably suppresses the occurrence of a crack in the element body 3.

The end edge of the region $6c_2$ may be substantially linear. The end edge of the region $6c_2$ may include a side extending in the third direction D3 and a side extending in the first direction D1. The end edge of the region $6c_2$ includes the end edge E2e of the second electrode layer E2.

Although the embodiments and modifications of the present invention have been described above, the present invention is not necessarily limited to the embodiments and modifications, and the embodiment can be variously changed without departing from the scope of the invention.

The first electrode layer E1 may be formed on the principal surface 3a to extend over the ridge portion 3g entirely or partially from the end surface 3e. The first electrode layer E1 may be formed on the principal surface 3b to extend over the ridge portion 3h entirely or partially from the end surface 3e. The first electrode layer E1 may be formed on the side surface 3c to extend over the ridge portion 3i entirely or partially from the end surface 3e.

The electronic component of the first embodiment is a multilayer capacitor C1. The electronic component of the second embodiment is a multilayer feedthrough capacitor C3. Applicable electronic components are not limited to multilayer capacitors and multilayer feedthrough capacitors. Examples of the applicable electronic components include, but not limited to, multilayer electronic components such as a multilayer inductor, a multilayer varistor, a multilayer piezoelectric actuator, a multilayer thermistor, or a multilayer electronic component, and electronic components other than the multilayer electronic components.

What is claimed is:
1. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
a plurality of external electrodes disposed at both end portions of the element body in the third direction, the plurality of external electrodes including a conductive resin layer covering a region near the first principal surface of a corresponding end surface of the pair of end surfaces,
wherein a height of the conductive resin layer extending along the corresponding end surface in the first direction is larger at ends of the conductive resin layer adjacent to edges of the side surfaces in the second direction than at a center of the conductive resin layer between the ends in the second direction, when viewed from the third direction, and
the conductive resin layer does not cover a region near the second principal surface of the corresponding end surface of the pair of end surfaces.
2. The electronic component according to claim 1, wherein
the conductive resin layer covers a region near the first principal surface of a first ridge portion located between the corresponding end surface and the side surface, and when viewed from the third direction, a height of a portion of the conductive resin layer covering the first ridge portion in the first direction is larger than a height of the conductive resin layer at the center in the second direction.

3. The electronic component according to claim 1, wherein
the conductive resin layer covers a region near the corresponding end surface of the first principal surface.

4. The electronic component according to claim 3, wherein
the conductive resin layer integrally covers a region near the corresponding end surface of the first principal surface and a region near the first principal surface of the corresponding end surface.

5. The electronic component according to claim 4, wherein
the conductive resin layer integrally covers a region near the corresponding end surface of the first principal surface, a region near the first principal surface of the corresponding end surface, and a region near the first principal surface of the side surface.

6. The electronic component according to claim 1, further comprising:
an internal conductor exposed to the corresponding end surface, wherein
the plurality of external electrodes further includes a sintered metal layer formed on the corresponding end surface to be connected to the internal conductor, and
the sintered metal layer includes a first region covered with the conductive resin layer and a second region exposed from the conductive resin layer.

7. The electronic component according to claim 6, wherein
the sintered metal layer is also formed on a first ridge portion located between the corresponding end surface and the side surface and a second ridge portion located between the corresponding end surface and the first principal surface, and
the conductive resin layer covers a part of a portion of the sintered metal layer formed on the first ridge portion and an entirety of a portion of the sintered metal layer formed on the second ridge portion.

8. The electronic component according to claim 6, wherein
the plurality of external electrodes further includes a plating layer covering the conductive resin layer and the second region of the sintered metal layer.

9. An electronic component device comprising:
the electronic component according to claim 1; and
an electronic device including a plurality of pad electrodes, wherein
each of the plurality of external electrodes is connected to a corresponding pad electrode among the plurality of pad electrodes via a solder fillet.

10. The electronic component device according to claim 9, wherein
the electronic component includes an internal conductor exposed to the corresponding end surface,
the external electrodes further include a sintered metal layer disposed between the conductive resin layer and the element body,
the sintered metal layer includes a first region covered with the conductive resin layer and a second region exposed from the conductive resin layer, and
the solder fillet overlaps the second region of the sintered metal layer when viewed from the third direction.

11. The electronic component device according to claim 10, wherein
the sintered metal layer is also formed on a first ridge portion located between the corresponding end surface and the side surface and a second ridge portion located between the corresponding end surface and the first principal surface, and
the conductive resin layer covers a part of a portion of the sintered metal layer formed on the first ridge portion and an entirety of a portion of the sintered metal layer formed on the second ridge portion.

12. The electronic component device according to claim 10, wherein
the plurality of external electrodes further includes a plating layer covering the conductive resin layer and the second region of the sintered metal layer.

13. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed at an end portion of the element body in the third direction, the external electrode including a conductive resin layer covering a region near the first principal surface of the end surface,
wherein a height of the conductive resin layer extending along the corresponding end surface in the first direction is larger at ends of the conductive resin layer adjacent to edges of the side surfaces in the second direction than at a center of the conductive resin layer between the ends in the second direction, when viewed from the third direction, and
the conductive resin layer does not cover a region near the second principal surface of the corresponding end surface of the pair of end surfaces.

14. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed at an end portion of the element body in the third direction, the external electrode including a conductive resin layer including a region positioned on the end surface,
wherein a height of the region of the conductive resin layer extending along the corresponding end surface in the first direction is larger at ends of the conductive resin layer adjacent to edges of the side surfaces in the second direction than at a center of the conductive resin layer between the ends in the second direction, and
the conductive resin layer does not cover a region near the second principal surface of the corresponding end surface of the pair of end surfaces.

15. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and a plurality of external electrodes disposed at both end portions of the element body in the third direction, the plurality of external electrodes including a conductive resin layer covering a region near the first principal surface of a corresponding end surface of the pair of end surfaces, wherein a height of the conductive resin layer in the first direction is larger at an end portion in the second direction than at a center in the second direction, when viewed from the third direction, the conductive resin layer covers a region near the first principal surface of a first ridge portion located between the corresponding end surface and the side surface, and when viewed from the third direction, a height of a portion of the conductive resin layer covering the first ridge portion in the first direction is larger than a height of the conductive resin layer at the center in the second direction.

16. The electronic component according to claim 15, wherein the conductive resin layer integrally covers a region near the corresponding end surface of the first principal surface, a region near the first principal surface of the corresponding end surface, and a region near the first principal surface of the side surface.

17. The electronic component according to claim 15, further comprising:
an internal conductor exposed to the corresponding end surface,
wherein the plurality of external electrodes further includes a sintered metal layer formed on the corresponding end surface to be connected to the internal conductor, and
the sintered metal layer includes a first region covered with the conductive resin layer and a second region exposed from the conductive resin layer.

18. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
a plurality of external electrodes disposed at both end portions of the element body in the third direction, the plurality of external electrodes including a conductive resin layer covering a region near the first principal surface of a corresponding end surface of the pair of end surfaces,
wherein a height of the conductive resin layer extending along the corresponding end surface in the first direction is larger at ends of the conductive resin layer adjacent to edges of the side surfaces portion in the second direction than at a center of the conductive resin layer between the ends in the second direction, when viewed from the third direction, and
the conductive resin layer integrally covers a region near the corresponding end surface of the first principal surface, a region near the first principal surface of the corresponding end surface, and a region near the first principal surface of the side surface.

19. The electronic component according to claim 18, further comprising:
an internal conductor exposed to the corresponding end surface, wherein the plurality of external electrodes further includes a sintered metal layer formed on the corresponding end surface to be connected to the internal conductor, and
the sintered metal layer includes a first region covered with the conductive resin layer and a second region exposed from the conductive resin layer.

20. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction;
a plurality of external electrodes disposed at both end portions of the element body in the third direction, the plurality of external electrodes including a conductive resin layer covering a region near the first principal surface of a corresponding end surface of the pair of end surfaces; and
an internal conductor exposed to the corresponding end surface,
wherein a height of the conductive resin layer in the first direction is larger at an end portion in the second direction than at a center in the second direction, when viewed from the third direction,
the plurality of external electrodes further includes a sintered metal layer formed on the corresponding end surface to be connected to the internal conductor, and
the sintered metal layer includes a first region covered with the conductive resin layer and a second region exposed from the conductive resin layer, the first region being positioned near the first principal surface, the second region being positioned near the second principal surface.

21. The electronic component device according to claim 20, wherein
the sintered metal layer is also formed on a first ridge portion located between the corresponding end surface and the side surface and a second ridge portion located between the corresponding end surface and the first principal surface, and
the conductive resin layer covers a part of a portion of the sintered metal layer formed on the first ridge portion and an entirety of a portion of the sintered metal layer formed on the second ridge portion.

22. The electronic component device according to claim 20, wherein the plurality of external electrodes further includes a plating layer covering the conductive resin layer and the second region of the sintered metal layer.

23. An electronic component device comprising:
an electronic component, comprising:
an element body of a rectangular parallelepiped shape including a first principal surface arrange to constitute a mounting surface, a second principal surface opposing the first principal surface in a first direction, a pair of side surfaces opposing each other in a second direction, and a pair of end surfaces opposing each other in a third direction;
a plurality of external electrodes disposed at both end portions of the element body in the third direction; and
an internal conductor exposed to the corresponding end surface; and an electronic device including a plurality of pad electrodes, each of the pad electrodes being connected to a corresponding one of the plurality of external electrodes via a solder fillet, wherein a height of the conductive resin layer in the first direction is larger at an end portion in the second direction than at a center in the second direction, when viewed from a third direction, the plurality of external electrodes including a conductive resin layer covering a region near the first principal surface of a corresponding end surface of the pair of end surfaces, and a sintered metal layer disposed between the conductive resin layer and the element body, the sintered metal layer including a first region covered with the conductive resin layer and a second region exposed from the conductive resin layer, and the solder fillet overlaps the second region of the sintered metal layer when viewed from the third direction.

24. The electronic component device according to claim 10, wherein the sintered metal layer is also formed on a first ridge portion located between the corresponding end surface and the side surface and a second ridge portion located between the corresponding end surface and the first principal surface, and the conductive resin layer covers a part of a portion of the sintered metal layer formed on the first ridge portion and an entirety of a portion of the sintered metal layer formed on the second ridge portion.

25. The electronic component device according to claim 10, wherein the plurality of external electrodes further includes a plating layer covering the conductive resin layer and the second region of the sintered metal layer.

* * * * *